United States Patent
Sato

(10) Patent No.: US 8,310,575 B2
(45) Date of Patent: Nov. 13, 2012

(54) SOLID-STATE IMAGING DEVICE AND IMAGING APPARATUS

(75) Inventor: Kimihiko Sato, Tokyo (JP)

(73) Assignee: Sony Corporation, Tokyo (JP)

(*) Notice: Subject to any disclaimer, the term of this patent is extended or adjusted under 35 U.S.C. 154(b) by 274 days.

(21) Appl. No.: 12/760,237

(22) Filed: Apr. 14, 2010

(65) Prior Publication Data

US 2010/0265372 A1    Oct. 21, 2010

(30) Foreign Application Priority Data

Apr. 21, 2009    (JP) ................. 2009-103176

(51) Int. Cl.
*H04N 5/335*    (2011.01)
(52) U.S. Cl. ..................................... 348/294
(58) Field of Classification Search .............. 348/294, 348/394
See application file for complete search history.

(56) References Cited

U.S. PATENT DOCUMENTS
2007/0273779 A1* 11/2007 Abe et al. ................ 348/294

FOREIGN PATENT DOCUMENTS
JP    2003-264281    9/2003
JP    2003-273342    9/2003
* cited by examiner

*Primary Examiner* — Tuan Ho
*Assistant Examiner* — Shahbaz Nazrul
(74) *Attorney, Agent, or Firm* — SNR Denton US LLP

(57) ABSTRACT

A solid-state imaging device includes: a semiconductor substrate; photoelectric conversion units formed in array on the semiconductor substrate and forming a light receiving unit; and wiring sections formed in positions among the photoelectric conversion units. The wiring sections include wiring bodies formed by superimposing wiring layers on the light receiving unit and including a bottom wiring body on the semiconductor substrate side, a top wiring body on an uppermost side, and an intermediate wiring body between the bottom wiring body and the top wiring body, and contacts connecting the wiring bodies in order of vertical overlap, and in at least one of the wiring sections, the wiring bodies other than the bottom wiring body are superimposed while being shifted from a position right above the bottom wiring body, and amounts of shift of the intermediate wiring body and the contacts connected to the intermediate wiring body are the same.

14 Claims, 14 Drawing Sheets

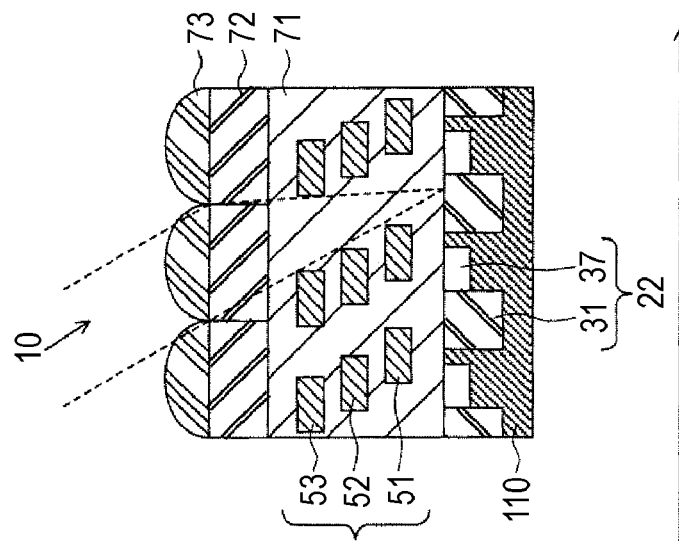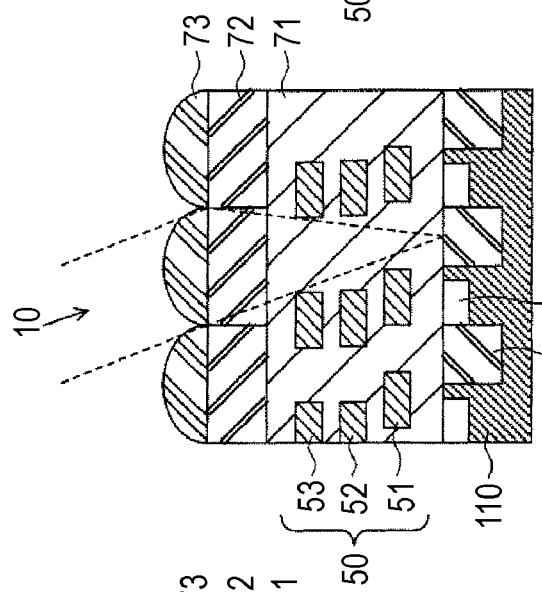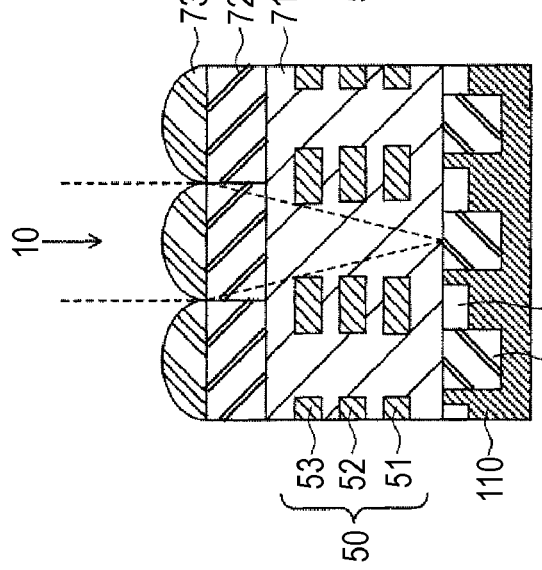

VERTICAL DIRECTION (V)

(A≠B)

VERTICAL DIRECTION (V)

FIG.12A  FIG.12B  FIG.12C
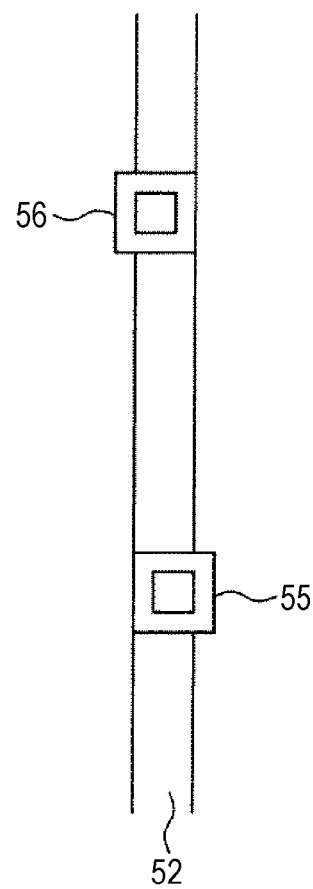
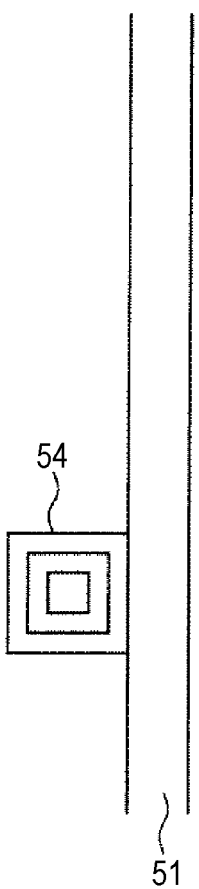
FIG.13
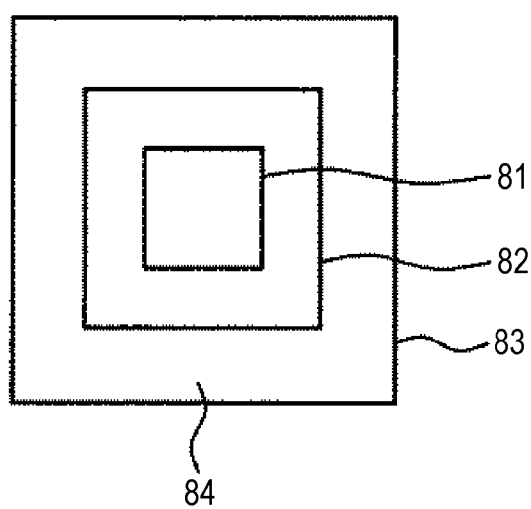

SOLID-STATE IMAGING DEVICE AND IMAGING APPARATUS

CROSS REFERENCES TO RELATED APPLICATIONS

This application contains subject matter related to and claims the benefit of priority from the prior Japanese Patent Application JP 2009-103176, filed in the Japanese Patent Office on 21 Apr. 2009, the disclosure of which is incorporated herein by reference in its entirety to the extent permitted by law.

BACKGROUND OF THE INVENTION

1. Field of the Invention

The present invention relates to a solid-state imaging device and an imaging apparatus including wiring sections formed in a light receiving unit in which plural photoelectric conversion units are arrayed.

2. Description of the Related Art

JP-A-2003-273342 (Patent Document 1) and JP-A-2003-264281 (Patent Document 2) disclose a solid-state imaging device.

In the solid-state imaging device, plural photoelectric conversion units are two-dimensionally arrayed in a light receiving unit of a semiconductor substrate.

Plural wiring sections are formed on the light receiving unit of the semiconductor substrate to extend along a predetermined array direction of the photoelectric conversion units.

The wiring sections include laminated wiring bodies in plural layers.

Light of a subject or the like condensed by an optical unit is condensed on the light receiving unit of the solid-state imaging device.

Therefore, in Patent Document 1, in the wiring sections in a peripheral portion of the light receiving unit, the plural wiring bodies are superimposed while being shifted toward the center of the light receiving unit.

Consequently, light made incident on the photoelectric conversion units in the peripheral portion of the light receiving unit from an oblique direction is less easily blocked by the plural wiring bodies.

In Patent Document 2, the plural wiring bodies are superimposed while being shifted from one another such that a contour edge formed by two sets of wiring bodies on both sides of one photoelectric conversion unit are formed in a reverse taper shape.

Consequently, light condensed on the photoelectric conversion unit is less easily blocked by the plural wiring bodies.

SUMMARY OF THE INVENTION

However, when one wiring section is formed by the plural wiring bodies, it is necessary to connect connection conductors for forming via contacts to the respective wiring bodies and electrically connect the connection conductors, which vertically overlap, by the via contacts.

When the plural wiring bodies are shifted little by little in order to obtain predetermined overlapping positions as described in Patent Document 1 or 2, movement margins corresponding to amounts of shift of the respective plural connection conductors needs to be secured for the connection conductors.

Therefore, in Patent Document 1 or 2, the plural connection conductors connected to the plural wiring bodies have a large size including an extension region. As a result, the width of respective wiring patterns formed by the wiring bodies and the connection conductors is large.

In Patent Document 1 or 2, since the width of the respective wiring patterns is large, the width of an opening between two wiring patterns adjacent to both sides of one photoelectric conversion unit is narrow.

As a result, when the laminated plural wiring bodies are shifted little by little as described in Patent Document 1 or 2, an amount of light passing between the two wiring patterns decreases to cause deterioration in substantial sensitivity of the photoelectric conversion units.

When the width of the opening is narrow because of the large width of the respective wiring patterns, angle dependency of incident light increases.

Therefore, the substantial sensitivity of the photoelectric conversion units markedly changes when an incident angle of light deviates only a little.

In this way, improvement of the substantial sensitivity of the photoelectric conversion units is demanded in the solid-state imaging device and the imaging apparatus.

According to a first embodiment of the present invention, there is provided a solid-state imaging device including: a semiconductor substrate; plural photoelectric conversion units that are formed in array on the semiconductor substrate and form a light receiving unit on a semiconductor substrate; and plural wiring sections formed in positions among the plural photoelectric conversion units on the light receiving unit. Each of the plural wiring sections includes: plural wiring bodies respectively formed by superimposing plural wiring layers on the light receiving unit on the semiconductor substrate and including a bottom wiring body on the semiconductor substrate side, a top wiring body on the uppermost side, and an intermediate wiring body between the bottom wiring body and the top wiring body; and plural contacts that connect the plural wiring bodies in order of vertical overlap. In at least one of the plural wiring sections, the wiring bodies other than the bottom wiring body are superimposed while being shifted from a position right above the bottom wiring body. An amount of shift of the intermediate wiring body and an amount of shift of the plural contacts connected to the intermediate wiring body are the same.

According to a second embodiment of the present invention, there is provided an imaging apparatus including: an optical unit that condenses light; and a solid-state imaging device that receives the light condensed by the optical unit. The solid-state imaging device includes: a semiconductor substrate; plural photoelectric conversion units that are formed in array on the semiconductor substrate and form a light receiving unit on a semiconductor substrate; and plural wiring sections formed in positions among the plural photoelectric conversion units on the light receiving unit. Each of the plural wiring sections includes: plural wiring bodies respectively formed by superimposing plural wiring layers on the light receiving unit on the semiconductor substrate and including a bottom wiring body on the semiconductor substrate side, a top wiring body on the uppermost side, and an intermediate wiring body between the bottom wiring body and the top wiring body; and plural contacts that connect the plural wiring bodies in order of vertical overlap. In at least one of the plural wiring sections, the wiring bodies other than the bottom wiring body are superimposed while being shifted from a position right above the bottom wiring body. An amount of shift of the intermediate wiring body and an amount of shift of the plural contacts connected to the intermediate wiring body are the same.

In the first embodiment, the amount of shift of the intermediate wiring bodies and the amount of shift of the plural contacts are the same.

Therefore, in the first embodiment, it is possible to reduce the width of the intermediate wiring bodies necessary for connecting the contacts to the intermediate wiring bodies compared with the width of the intermediate wiring bodies shifted from the contacts in terms of design. The intermediate wiring bodies less easily project to the photoelectric conversion units side from a space between the top wiring bodies and the bottom wiring bodies.

As a result, in the first embodiment, light that has passed through openings formed by the top wiring bodies is less easily blocked by the intermediate wiring bodies. Therefore, it is possible to improve the substantial sensitivity of the photoelectric conversion units.

According to the embodiments of the present invention, it is possible to improve the substantial sensitivity of the photoelectric conversion units.

BRIEF DESCRIPTION OF THE DRAWINGS

FIGS. 5A to 5C are schematic partial sectional views of a pixel unit shown in FIG. 3, wherein FIG. 5A is a schematic partial sectional view of a center portion of the pixel unit, FIG. 5B is a schematic partial sectional view of an intermediate portion of the pixel unit, and FIG. 5C is a schematic partial sectional view of a peripheral portion of the pixel unit;

FIGS. 12A to 12C are diagrams of examples of wiring patterns of plural wiring layers shown in FIG. 7, wherein FIG. 12A is a diagram of a wiring pattern of a top wiring layer, FIG. 12B is a diagram of a wiring pattern of an intermediate wiring layer; and FIG. 12C is a diagram of an example of a bottom wiring layer;

FIG. 13 is a diagram for explaining the size of a connection conductor;

FIGS. 14A and 14B are diagrams for explaining the width of an opening formed by intermediate wiring bodies, wherein FIG. 14A is a diagram for explaining a comparative example and FIG. 14B is a diagram for explaining the embodiment;

DESCRIPTION OF THE PREFERRED EMBODIMENTS

An embodiment of the present invention is explained below with reference to the accompanying drawings. The explanation is made in the following order.

1. Configuration of an imaging apparatus;
2. Configuration of a solid-state imaging device;
3. Layout of various wires and photoelectric conversion units in a light receiving unit;
4. Section of wiring sections;
5. Shapes of wiring bodies of the wiring section; and
6. Operation of the imaging apparatus Configuration of an Imaging Apparatus 1

Figure 1:
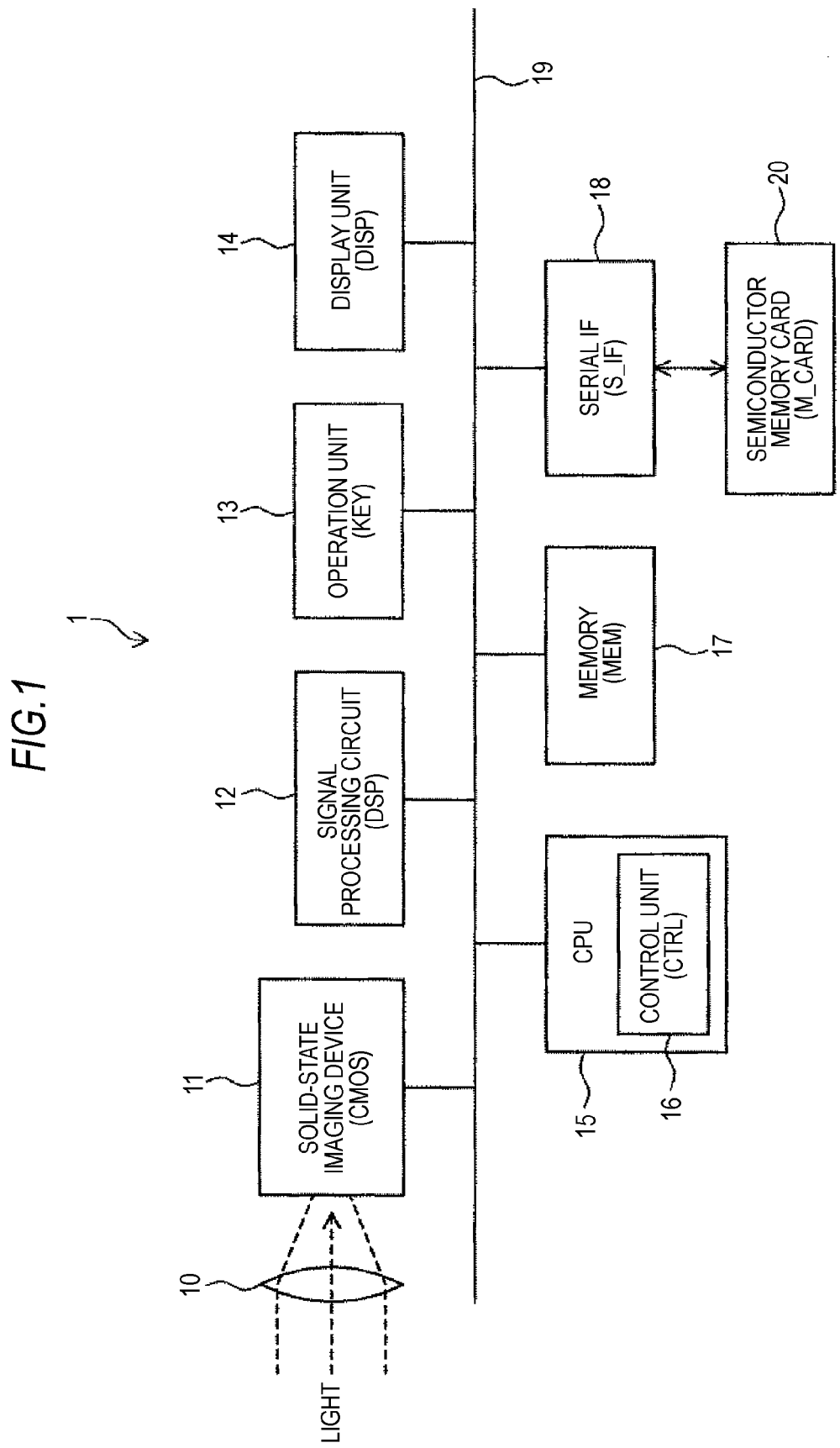
FIG. 1 is a block diagram of an imaging apparatus according to an embodiment of the present invention.

FIG. 1 is a block diagram of an imaging apparatus 1 according to an embodiment of the present invention.

The imaging apparatus 1 includes an optical unit 10, a solid-state imaging device (CMOS) 11, a signal processing circuit (DSP) 12, an operation unit (KEY) 13, and a display unit (DISP) 14. Further, the imaging apparatus 1 includes a CPU (Central Processing Unit) 15, a memory (MEM) 17, a serial interface unit (S_IF) 18, and a system bus 19 that connects these units.

Such an imaging apparatus 1 is used as, for example, a portable terminal apparatus, a digital still camera, a digital single lens reflex camera, and a digital video camera.

Figure 2:
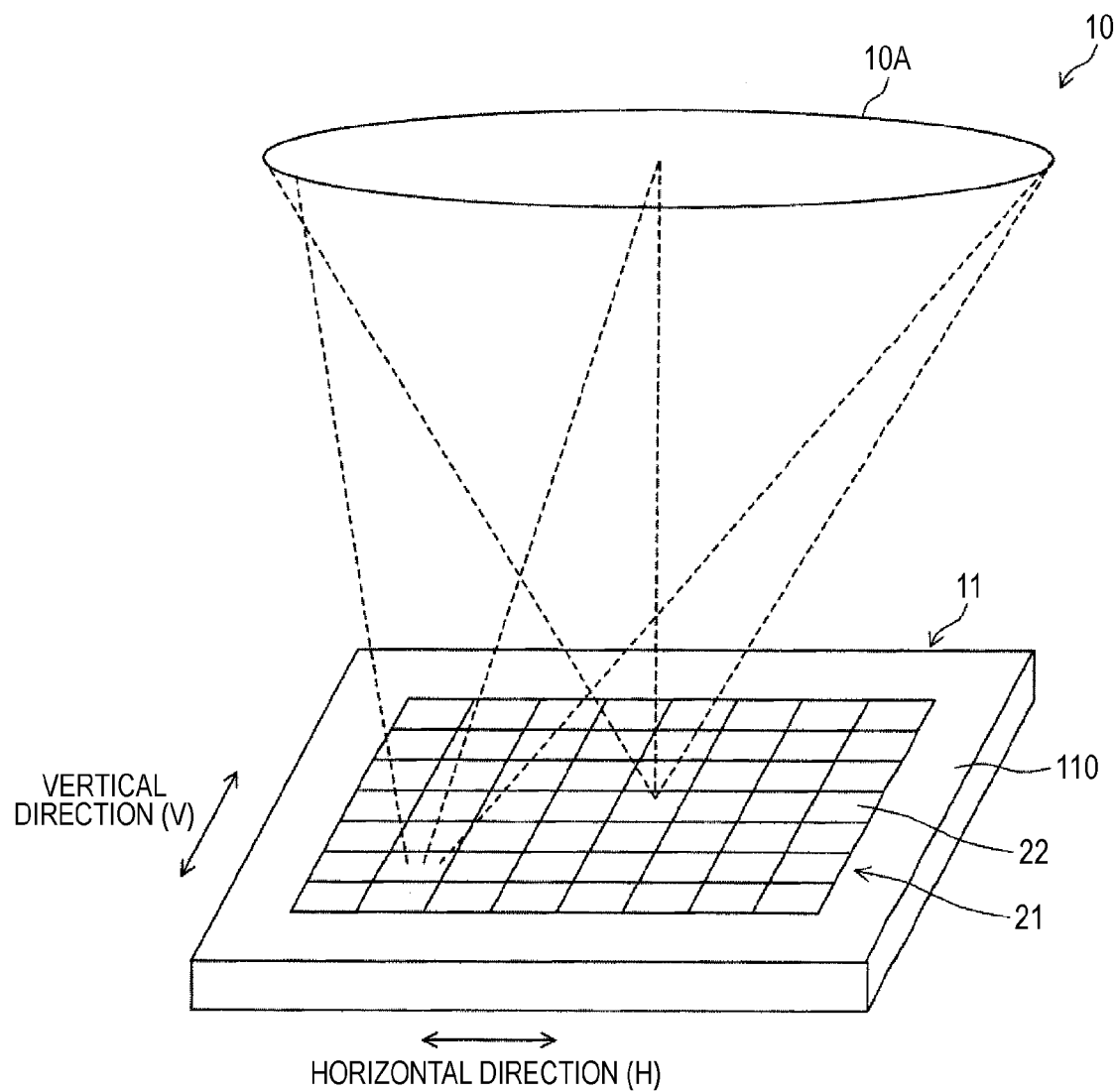
FIG. 2 is a schematic diagram for explaining an optical system shown in FIG. 1.

FIG. 2 is a schematic diagram for explaining the schematic optical arrangement of the optical unit 10 and the solid-state imaging device 11.

The optical unit 10 includes a condenser lens 10A.

The optical unit 10 condenses light of a subject.

The solid-state imaging device 11 is a CMOS sensor.

The solid-state imaging device 11 includes a light receiving unit 21 that receives the light of the subject.

As explained later, plural pixel circuits 22 are two-dimensionally arrayed in the light receiving unit 21.

The light of the subject is condensed on the light receiving unit 21 by the optical unit 10.

As shown in FIG. 2, an optical axis of the optical unit 10 is set in the center of the light receiving unit 21.

Therefore, the light condensed by the optical unit 10 is made incident on the center of the light receiving unit 21 from right above and is made incident on the peripheral portion of the light receiving unit 21 from an oblique direction.

The solid-state imaging device 11 outputs an output signal including a value of an amount of light received by the plural pixel circuits 22.

The signal processing circuit 12 is connected to the solid-state imaging device 11.

The signal processing circuit 12 obtains, for example, a full-color image of three colors R, G, and B from the output signal of the solid-state imaging device 11 input from the solid-state imaging device 11.

Consequently, the signal processing circuit 12 generates an image signal including full-color image data.

The signal processing circuit 12 outputs the generated image signal to the system bus 19.

The operation unit 13 includes plural operation keys.

The operation keys include a power supply key and an imaging key.

The operation unit 13 generates a signal including a value corresponding to an operated key.

The operation unit 13 outputs the generated signal to the CPU 15 through the system bus 19.

The display unit 14 displays an image.

For example, when the image signal is input from the system bus 19, the display unit 14 displays an image based on the image data included in the input image signal.

A semiconductor memory card (M_CARD) 20 is detachably connected to the serial interface unit 18.

The semiconductor memory card 20 only has to be, for example, a flash memory.

The serial interface unit 18 accesses the semiconductor memory card 20 inserted therein.

For example, when the image signal is input from the serial bus 19, the serial interface unit 18 stores the image data or the like included in the input image signal in the semiconductor memory card 20.

The memory 17 stores, for example, a computer program that the CPU 15 can execute and data generated by the CPU 15 or the like.

When the image signal is input from the system bus 19, the memory 17 stores the image data included in the input image signal.

The computer program stored in the memory 17 may be stored in the memory 17 in advance before the shipment of the imaging apparatus 1 or may be stored in the memory 17 after the shipment.

The computer program stored in the memory 17 after the shipment only has to be obtained by, for example, installing a computer program stored in a computer-readable recording medium.

The computer program stored in the memory 17 after the shipment may be obtained by installing a computer program downloaded through a transmission medium such as the Internet.

The CPU 15 executes the computer program stored in the memory 17.

Consequently, the control unit (CTRL) 16 is realized in the CPU 15.

The control unit 16 controls the operation of the imaging apparatus 1.

For example, when a signal generated by the operation of the imaging key is input from the operation unit 13, the control unit 16 instructs the solid-state imaging device 11 to start imaging.

Configuration of the Solid-State Imaging Device

Figure 3:
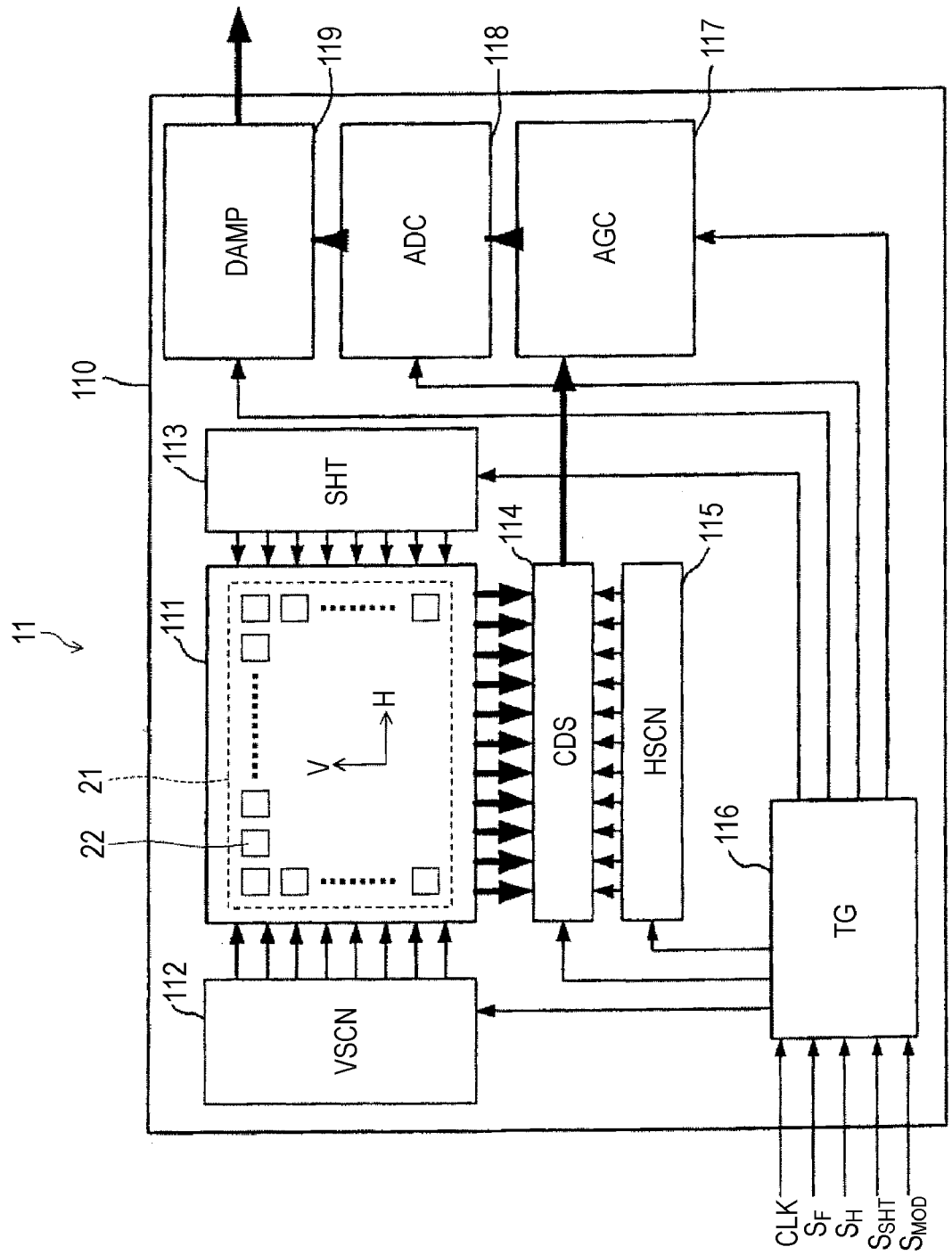
FIG. 3 is a block layout diagram of an example of a solid-state imaging device shown in FIG. 1.

FIG. 3 is a layout diagram of an example of a block layout of the solid-state imaging device 11 shown in FIG. 1. The solid-state imaging device 11 shown in FIG. 3 is an example of a CMOS image sensor.

The solid-state imaging device 11 can perform, in row units, readout of signals from the plural pixel circuits 22.

In FIG. 3, for convenience of explanation, the sizes of blocks are enlarged or reduced and rendered as appropriate.

The solid-state imaging device 11 includes a semiconductor substrate 110.

On the semiconductor substrate 110, a pixel unit (SNS) 111, a row selection circuit (VSCN) 112, a shutter row selection circuit (SHT) 113, a correlated double sampling circuit (CDS) 114, a column selection circuit (HSCN) 115, and the like are formed.

Further, on the semiconductor substrate 110, an AGC circuit (AGC) 117, an analog-to-digital converter (ADC) 118, a digital amplifier circuit (DAMP) 119, and a timing generator (TG) 116 are formed.

These circuits are connected to one another by, for example, wires formed on the semiconductor substrate 110.

The pixel unit 111 includes the plural pixel circuits 22. The plural pixel circuits 22 are two-dimensionally arrayed on one surface of the semiconductor substrate 110.

A range in which the plural pixel circuits 22 are arrayed is the light receiving unit 21 of the semiconductor substrate 110.

In the following explanation, a left to right direction of the pixel unit 111 in the block diagram of FIG. 3 is referred to as horizontal direction.

An up to down direction of the pixel unit 111 in the block diagram of FIG. 3 is referred to as vertical direction.

The light receiving unit 21 shown in FIG. 3 is a rectangular area longer in the horizontal direction than in the vertical direction.

Figure 4:
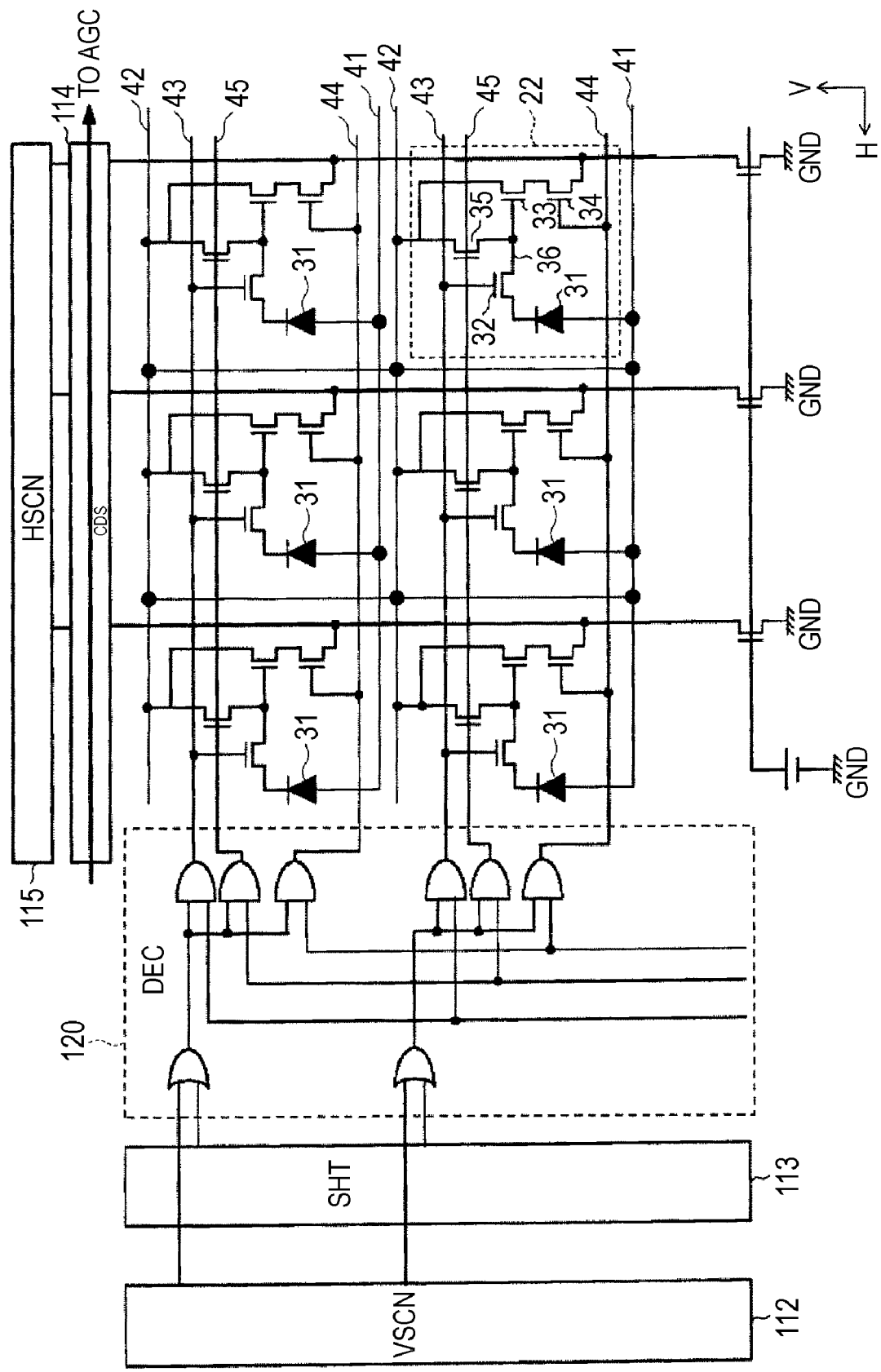
FIG. 4 is a detailed block diagram of a pixel circuit and a peripheral circuit shown in FIG. 3.

FIG. 4 is a detailed block diagram of the pixel circuit 22.

In FIG. 4, the plural pixel circuits 22 in 2 rows×3 columns and various peripheral circuits are shown.

Various signal lines and power supply lines are connected to the plural pixel circuits 22.

The various signal lines are connected to the peripheral circuits.

As such various signal lines and power supply lines, for example, there are a ground line 41, a power supply line 42, a transfer signal line 43, a selection signal line 44, a reset signal line 45, and a pixel output line 46.

In FIG. 4, an area surrounded by square broken lines is one pixel circuit 22.

The plural pixel circuits 22 are two-dimensionally arrayed in the light receiving unit 21 of the semiconductor substrate 110.

Each of the plural pixel circuits 22 includes a photoelectric conversion unit 31, a transfer transistor 32, an amplification transistor 33, a selection transistor 34, and a reset transistor 35.

The photoelectric conversion unit 31 is a photodiode formed on the semiconductor substrate 110.

The photodiode accumulates charges corresponding to an amount of received light.

An anode of the photodiode is connected to the ground line 41.

A cathode of the photodiode is connected to a source electrode of the transfer transistor 32.

The transfer transistor 32 is a MOS transistor formed on the semiconductor substrate 110.

A drain electrode of the transfer transistor 32 is connected to a gate electrode of the amplification transistor 33. A source electrode of the transfer transistor 32 is connected to the transfer signal line 43.

A signal line that connects the drain electrode of the transfer transistor 32 and the gate electrode of the amplification transistor 33 is called floating diffusion 36.

When the transfer signal line 43 is at a high level, the transfer transistor 32 forms a channel between the source electrode and the drain electrode.

Consequently, the floating diffusion 36 is connected to the photoelectric conversion unit 31.

The amplification transistor 33 is a MOS transistor formed on the semiconductor substrate 110.

A source electrode of the amplification transistor 33 is connected to the power supply line 42. A drain electrode of the amplification transistor 33 is connected to a source electrode of the selection transistor 34.

The selection transistor 34 is a MOS transistor formed on the semiconductor substrate 110.

A gate electrode of the selection transistor 34 is connected to the selection signal line 44. A drain electrode of the selection transistor 34 is connected to the pixel output line 46.

When the selection signal line 44 is at the high level, the selection transistor 34 is controlled to be on and the amplification transistor 33 is connected to the pixel output line 46.

When the photoelectric conversion unit 31 is connected to the gate electrode of the amplification transistor 33, the pixel output line 46 is set to a voltage level corresponding to an amount of charges accumulated in the photoelectric conversion unit 31.

The reset transistor 35 is a MOS transistor formed on the semiconductor substrate 110.

A gate electrode of the reset transistor 35 is connected to the reset signal line 45. A source electrode of the reset transistor 35 is connected to the power supply line 42. A drain electrode of the reset transistor 35 is connected to the floating diffusion 36.

When the reset signal line 45 is at the high level, the reset transistor 35 connects the floating diffusion 36 to the power supply line 42.

Consequently, the floating diffusion 36 is reset to a power supply voltage level.

As explained above, the pixel circuit 22 is connected to the ground line 41, the power supply line 42, the transfer signal line 43, the selection signal line 44, the reset signal line 45, and the pixel output line 46.

The plural pixel circuits 22 arrayed two-dimensionally are connected to plural ground lines 41, plural power supply lines 42, plural transfer signal lines 43, plural selection signal lines 44, plural reset signal lines 45, and plural pixel output lines 46.

For example, the plural pixel circuits 22 arrayed two-dimensionally are connected to the common transfer signal line 43, selection signal line 44, and reset signal line 45 for each one row.

The plural pixel circuits 22 arrayed two-dimensionally are connected to the common pixel output line 46 for each one column.

The plural power supply lines and the plural signal lines are connected to a decoder (DEC) 120, the correlated double sampling circuit 114, and the like formed around the plural pixel circuits 22. The decoder 120 is connected to the row selection circuit 112 and the shutter row selection circuit 113.

For example, the plural transfer signal lines 43, the plural selection signal lines 44, and the plural reset signal lines 45 are connected to the row selection circuit 112 and the shutter row selection circuit 113 by a predetermined logic circuit.

The row selection circuit 112 and the shutter row selection circuit 113 are arranged on one end side in the horizontal direction of the rectangular light receiving unit 21 long in horizontal direction.

Therefore, the plural transfer signal lines 43, the plural selection signal lines 44, and the plural reset signal lines 45 traverse the rectangular light receiving unit 21 over the entire width of the light receiving unit 21.

The plural pixel output lines 46 are connected to the correlated double sampling circuit 114. The correlated double sampling circuit 114 is arranged on one end side in the vertical direction of the light receiving unit 21.

Therefore, the plural pixel output lines 46 traverse the rectangular light receiving unit 21 over the entire width of the light receiving unit 21.

Similarly, the plural ground lines 41 and the plural power supply lines 42 are connected to the plural pixel circuits 22. Therefore, the plural ground lines 41 and the plural power supply lines 42 traverse the rectangular light receiving unit 21 over the entire width of the light receiving unit 21, as explained later.

Layout of Various Wires and Photoelectric Conversion Units 31 in the Light Receiving Unit 21

A layout of various wires and photoelectric conversion units 31 formed in the light receiving unit 21 is explained below.

FIGS. 5A to 5C are schematic partial sectional views of the pixel unit 111 of the solid-state imaging device 11 shown in FIG. 2.

FIG. 5A is a partial sectional view of a center portion of the pixel unit 111.

FIG. 5B is a partial sectional view of an intermediate portion between the center portion and a peripheral portion of the pixel unit 111.

FIG. 5C is a partial sectional view of the peripheral portion of the pixel unit 111.

As shown in FIGS. 5A to 5C, plural photoelectric conversion units 31 and plural MOS transistors 37 are formed on the semiconductor substrate 110 of the solid-state imaging device 11.

In FIGS. 5A to 5C, the plural photoelectric conversion units 31 are formed to be arranged at equal intervals.

The various MOS transistors 32 to 35 of the pixel circuits 22 are formed among the plural photoelectric conversion units 31.

In FIGS. 5A to 5C, each set of the photoelectric conversion unit 31 and the MOS transistor 37 shown in the figure corresponds to each of the pixel circuits 22. The MOS transistor 37 shown in FIGS. 5A to 5C is, for example, the transfer transistor 32.

An insulating film 71, a color filer array 72, and a lens array 73 are formed in that order on the semiconductor substrate 110 in the light receiving unit 21.

The insulating film 71 is formed of a transparent or a translucent insulative resin material.

A surface layer section on the upper side of the insulating film 71 is planarized by a passivation film.

The color filter array 72 includes plural filter units 72A.

The plural filter units 72A is colored in one color selected out of the three colors R, G, and B.

The filter units 72A are two-dimensionally arrayed in the light receiving unit 21 to correspond to the pixel circuits 22 in a one-to-one relation.

The lens array 73 includes plural lens units 73A.

The lens units 73A have a convex lens shape.

The lens units 73A are two-dimensionally arrayed in the light receiving unit 21 to correspond to the pixel circuits 22 in a one-to-one relation. Therefore, the lens units 73A overlap the filter units 72A, respectively.

Each set of the filter unit 71A and the lens unit 73A is located substantially above each of the pixel circuits 22.

Specifically, as shown in FIG. 5A, in the center portion of the light receiving unit 21, light is made incident on the pixel circuit 22 from right above. Therefore, the filter unit 72A and the lens unit 73A are formed right above the pixel circuit 22.

On the other hand, as shown in FIG. 5C, in the peripheral portion of the light receiving unit 21, light is made incident on the pixel circuit 22 from an oblique direction. Therefore, the filter unit 72A and the lens unit 73A are formed to be shifted in an oblique upward direction of the pixel circuit 22.

As shown in FIGS. 5A to 5C, plural wiring bodies 51 to 53 are formed in three layers in the insulating film 71.

The various signal lines and power supply lines that vertically and horizontally traverse the light receiving unit 21 are formed by the plural wiring bodies 51 to 53.

The three wiring layers extend in a direction perpendicular to the paper surface of FIGS. 5A to 5C.

The three wiring layers are electrically connected to one another by via contacts 59 and 60 explained later.

One wiring section 50 is formed by the wiring bodies 51 to 53 in the three layers.

Therefore, the wiring section 50 is used as, for example, the ground line 41, the power supply line 42, the transfer signal line 43, the selection signal line 44, the reset signal line 45, and the pixel output line 46.

Plural wiring sections 50 shown in FIGS. 5A to 5C extend along one direction (a direction perpendicular to the paper surface) of arraying directions of the photoelectric conversion units 31.

As explained later, in the plural wiring sections 50 shown in FIGS. 5A to 5C, amounts of shift of respective intermediate wiring bodies 52 with respect to respective bottom wiring bodies 51 are the same in the one arraying direction explained above (both the amounts of shift are zero).

Amounts of shift of the plural intermediate wiring bodies 52 in the other arraying direction (a direction in the paper surface of FIGS. 5A to 5C) of the two-dimensional arraying directions are different from each other.

The same holds true for plural top wiring bodies 53.

For example, as shown in FIG. 5A, the wiring section 50 is formed between adjacent two photoelectric conversion units 31 to avoid a light incident path extending from the filter unit 72A and the lens unit 73A to the photoelectric conversion unit 31 of the pixel circuit 22.

Specifically, for example, in the center portion of the light receiving unit 21 shown in FIG. 5A, among the wiring bodies 51 to 53 in the three layers of the wiring section 50, the intermediate wiring bodies 52 in the second layer are formed to be superimposed in positions right above the bottom wiring bodies 51 in the first layer on the semiconductor substrate 110 side.

The top wiring bodies 53 in the third layer are formed to be superimposed in positions right above the intermediate wiring bodies 52 in the second layer.

In the intermediate portion of the light receiving unit 21 shown in FIG. 5B, for example, among the wiring bodies 51 to 53 in the three layers of the wiring section 50, the intermediate wiring bodies 52 in the second layer are formed to be slightly shifted to the center from positions right above the bottom wiring bodies 51 in the first layer on the semiconductor substrate 110 side.

The top wiring bodies 53 in the third layer is formed to be slightly shifted to the center from positions right above the intermediate wiring bodies 52 in the second layer.

In the peripheral portion of the light receiving unit 21 shown in FIG. 5C, for example, among the wiring bodies 51 to 53 in the three layers of the wiring section 50, the intermediate wiring bodies 52 in the second layer are formed to be further shifted to the center than FIG. 5B from positions right above the bottom wiring bodies 51 in the first layer on the semiconductor substrate 110 side.

The top wiring bodies 53 in the third layer are formed to be further shifted to the center than FIG. 5B from positions right above the intermediate wiring bodies 52 in the second layer. Section of the Wiring Sections 50

Figure 6:
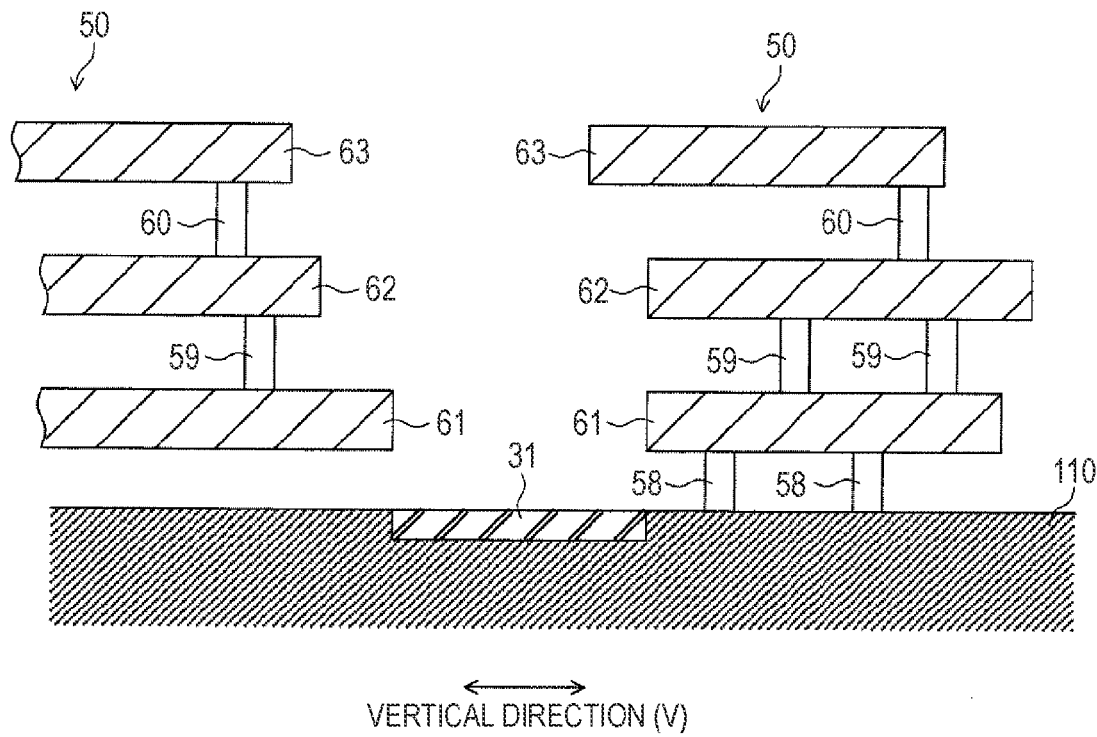
FIG. 6 is a schematic diagram of the sectional structure of wiring sections in a center portion of a light receiving unit shown in FIG. 2.

FIG. 6 is a schematic diagram of the sectional structure of the wiring sections 50 in the center portion of the light receiving unit 21.

Figure 7:
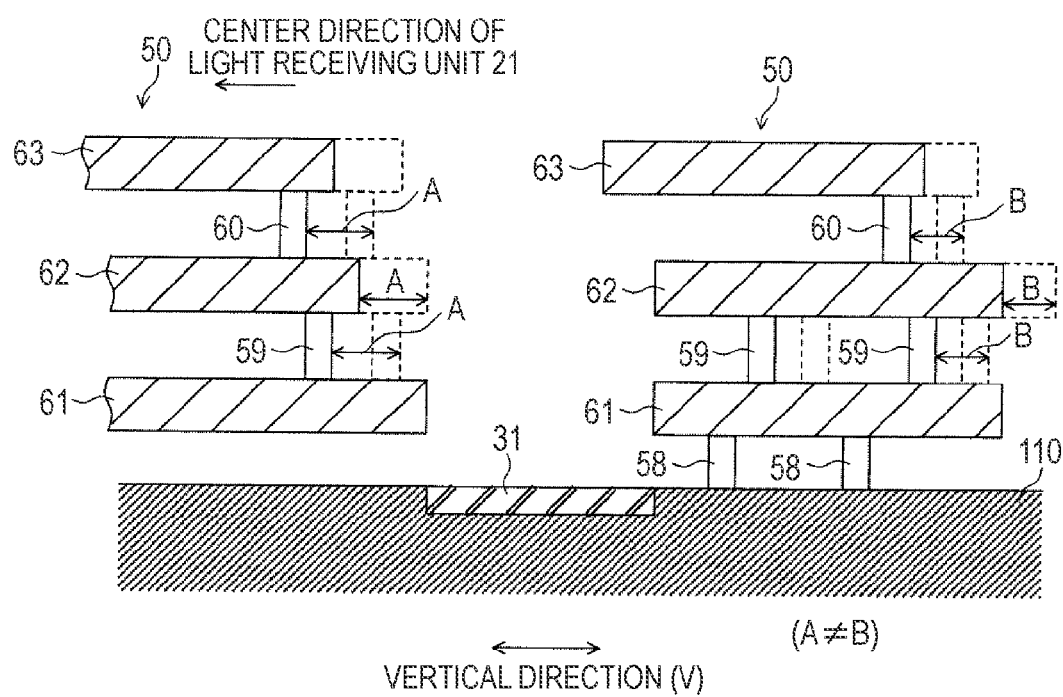
FIG. 7 is a schematic diagram of the sectional structure of wiring sections in a peripheral portion of the light receiving unit shown in FIG. 2.

FIG. 7 is a schematic diagram of the sectional structure of the wiring sections 50 in the peripheral portion of the light receiving unit 21.

In FIG. 7, positions of the wiring sections 50 in the center portion of FIG. 6 are indicated by dotted lines.

In FIGS. 6 and 7, the wiring bodies 51 to 53 in the three layers extending in a direction perpendicular to the paper surface are, for example, the wiring sections 50 extending in the lateral direction (the horizontal direction) of the rectangular light receiving unit 21.

The wiring bodies 51 to 53 in the three layers are divided to be formed in a bottom wiring layer 61, an intermediate wiring layer 62, and a top wiring layer 63.

In the wiring sections 50 in the peripheral portion shown in FIG. 7, unlike the wiring sections 50 in the center portion shown in FIG. 6, the wiring bodies 51 to 53 in the three layers are superimposed while being shifted from one another.

Specifically, the wiring bodies 51 to 53 in the three layers are shifted in the center direction of the light receiving unit 21 (the right side direction in FIG. 7).

An amount of shift of the intermediate wiring layer 62 and the contacts 59 and 60 in the wiring section 50 on the left side of FIG. 7 is "A", which is different from an amount of shift "B" of the intermediate wiring layer 62 and the contacts 59 and 60 in the wiring section 50 on the right side in FIG. 7.

The shift of the plural wiring layers 61 to 63 is explained below.

FIGS. 8 to 11 are top views of one pixel circuit 22 formed on a certain semiconductor substrate 110 viewed from a light incident direction. As indicated by a square dotted line in FIG. 8, the photoelectric conversion unit 31 of the pixel circuit 22 is formed on the semiconductor substrate 110.

In FIGS. 8 to 11, as plural bottom wiring layers 61, a left side bottom wiring layer 61-1, a right side bottom wiring layer 61-1, and a lower side bottom wiring layer 61-3 are formed.

The left side bottom wiring layer 61-1 is formed on the left side of the photoelectric conversion unit 31 not to overlap a formation area of the photoelectric conversion unit 31.

The right side bottom wiring layer 61-2 is formed on the right side of the photoelectric conversion unit 31 not to overlap the formation area of the photoelectric conversion unit 31.

The lower side bottom wiring layer 61-3 is formed on the right receiving unit 21 of the semiconductor substrate 110 to be superimposed on a polysilicon gate electrode.

In FIGS. 8 to 11, as plural intermediate wiring layers 62, a left side intermediate wiring layer 62-1, a right side intermediate wiring layer 62-2, and a lower side intermediate wiring layer 62-3 are formed.

Figure 8:
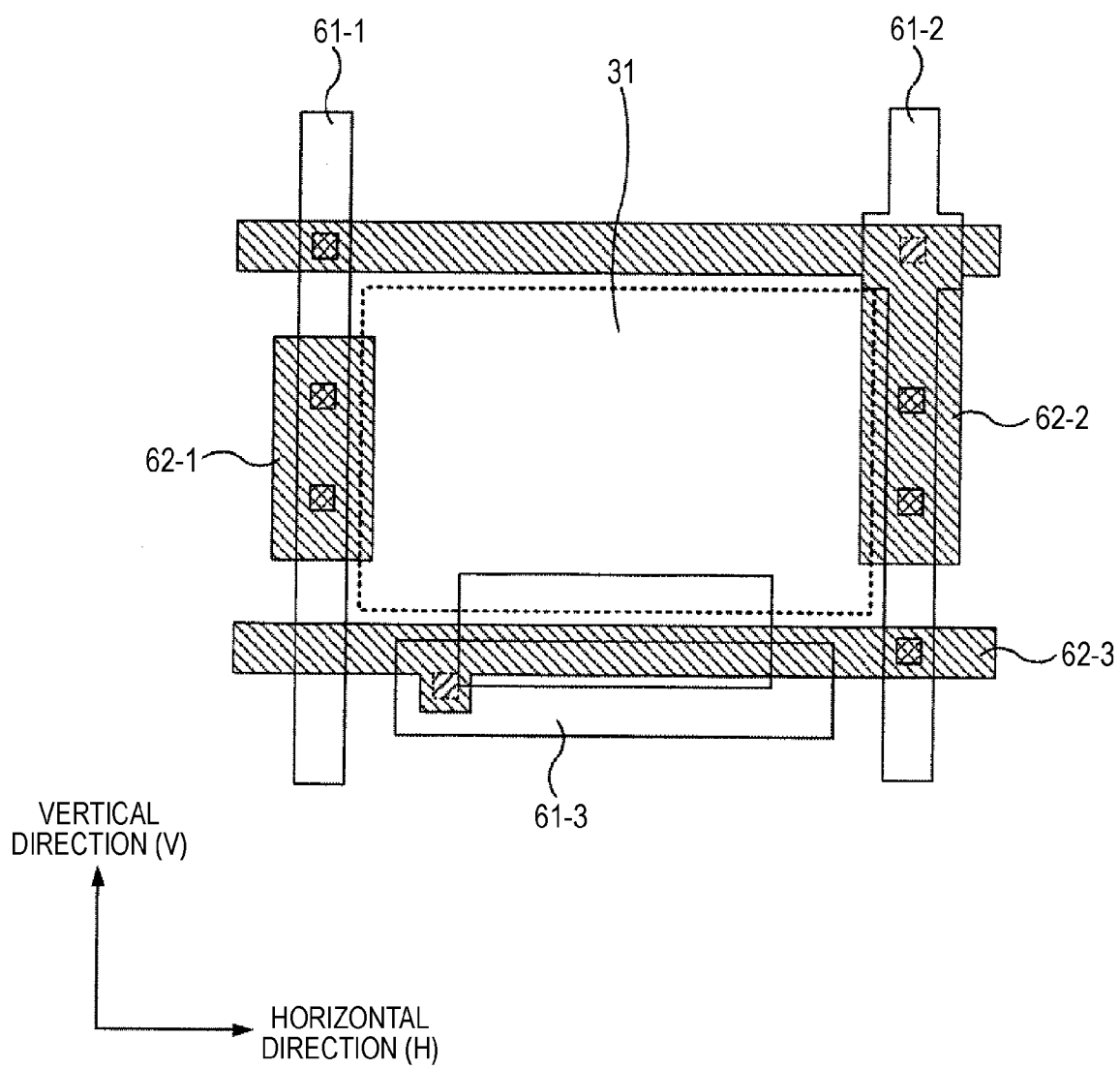
FIG. 8 is a diagram for explaining an amount of shift of plural wiring bodies (without a shift)

In FIG. 8, the left side intermediate wiring layer 62-1 is formed to be superimposed on the left side bottom wiring layer 61-1. In this case, the center in the wiring width of the left side intermediate wiring layer 62-1 overlaps the center in the wiring width of the left side bottom wiring layer 61-1.

In FIG. 8, the right side intermediate wiring layer 62-2 is formed to be superimposed on the right side bottom wiring layer 61-2. In this case, the center in the wiring width of the right side intermediate wiring layer 62-2 overlaps the center in the wiring width of the right side bottom wiring layer 61-2.

In FIG. 8, the lower side intermediate wiring layer 62-3 is formed to be superimposed on the lower side bottom wiring layer 61-3.

In this way, in FIG. 8, the center in the wiring width of the intermediate wiring layer 62 overlaps the center in the wiring width of the bottom wiring layer 61. The intermediate wiring layer 62 is not shifted from the bottom wiring layer 61.

Figure 9:
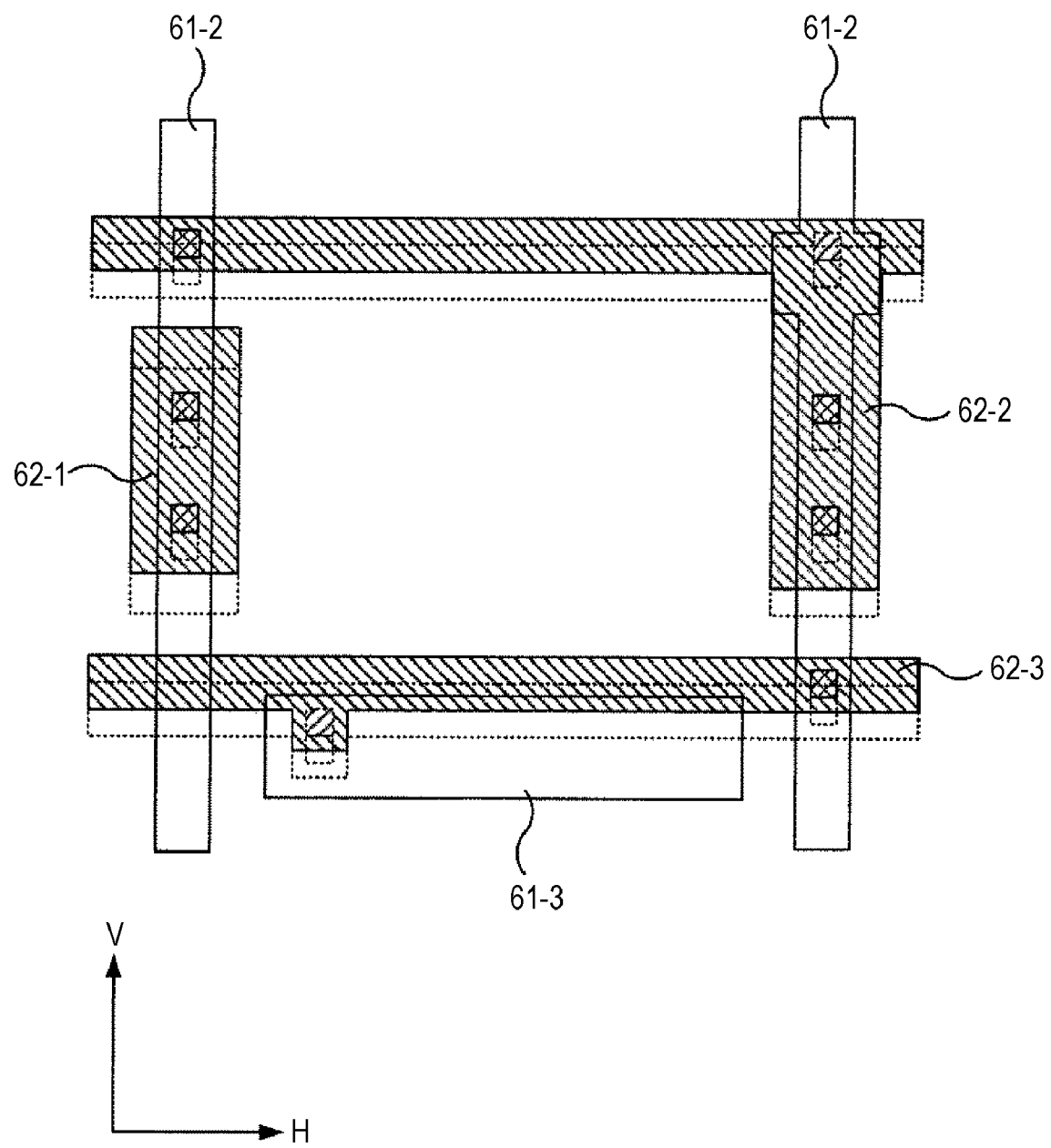
FIG. 9 is a diagram for explaining an amount of shift of the plural wiring bodies (with a shift in the vertical direction)

On the other hand, in FIG. 9, the intermediate wiring layer 62 is shifted to the upper side in the vertical direction (an up to down direction in FIG. 9).

In this case, the center in the wiring width of the intermediate wiring layer 62 does not overlap the center in the wiring width of the bottom wiring layer 61.

The lower side intermediate wiring layer 62-3 overlaps the formation area of the photoelectric conversion unit 31.

Figure 10:
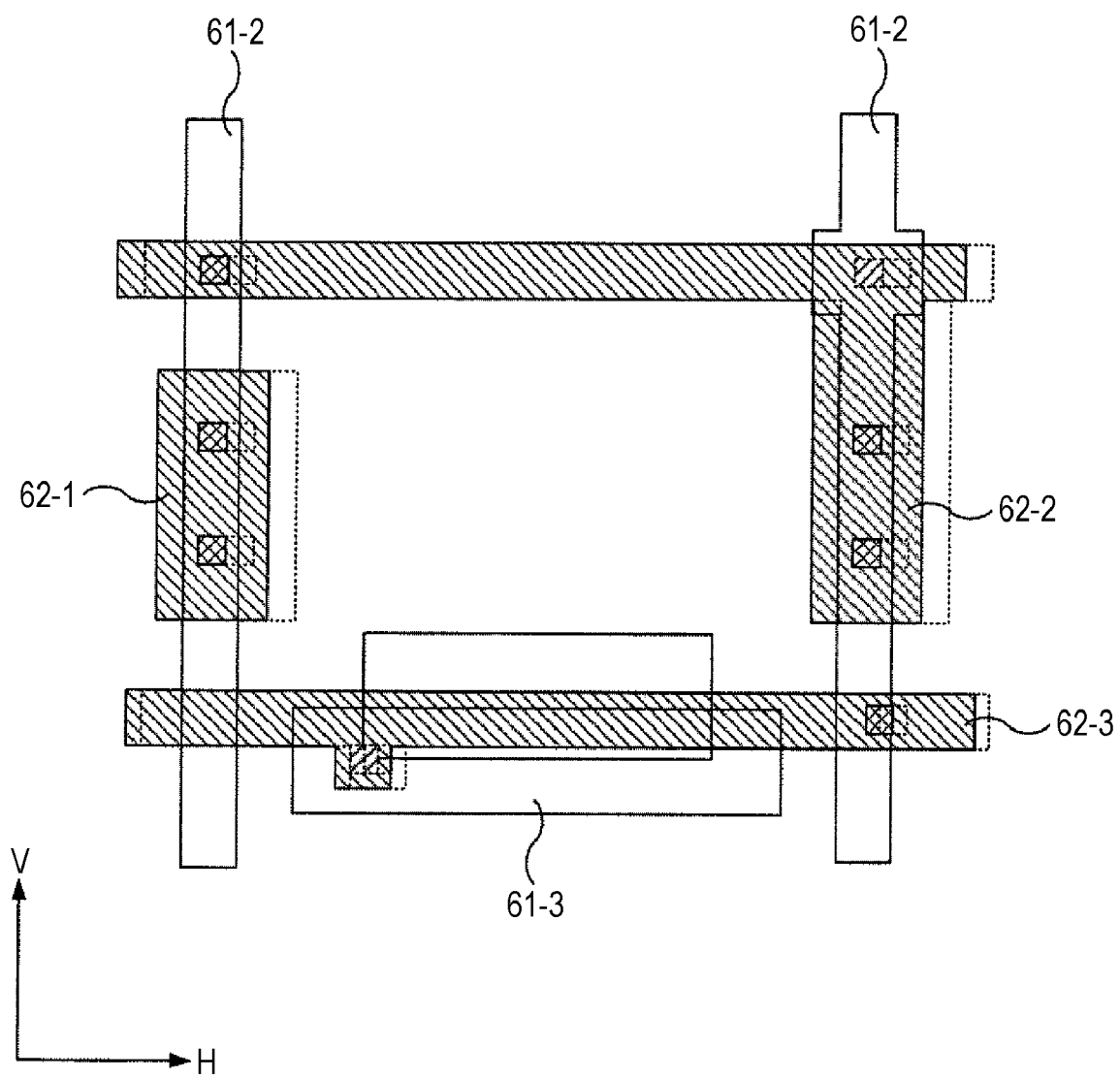
FIG. 10 is a diagram for explaining an amount of shift of the plural wiring bodies (with a shift in the horizontal direction)

In FIG. 10, the intermediate wiring layer 62 is shifted to the left side in the horizontal direction (a left to right direction in FIG. 10).

In this case, the center in the wiring width of the intermediate wiring layer 62 does not overlap the center in the wiring width of the bottom wiring layer 61.

The overlap of the right side intermediate wiring layer 62-2 and the formation area of the photoelectric conversion unit 31 is large.

Figure 11:
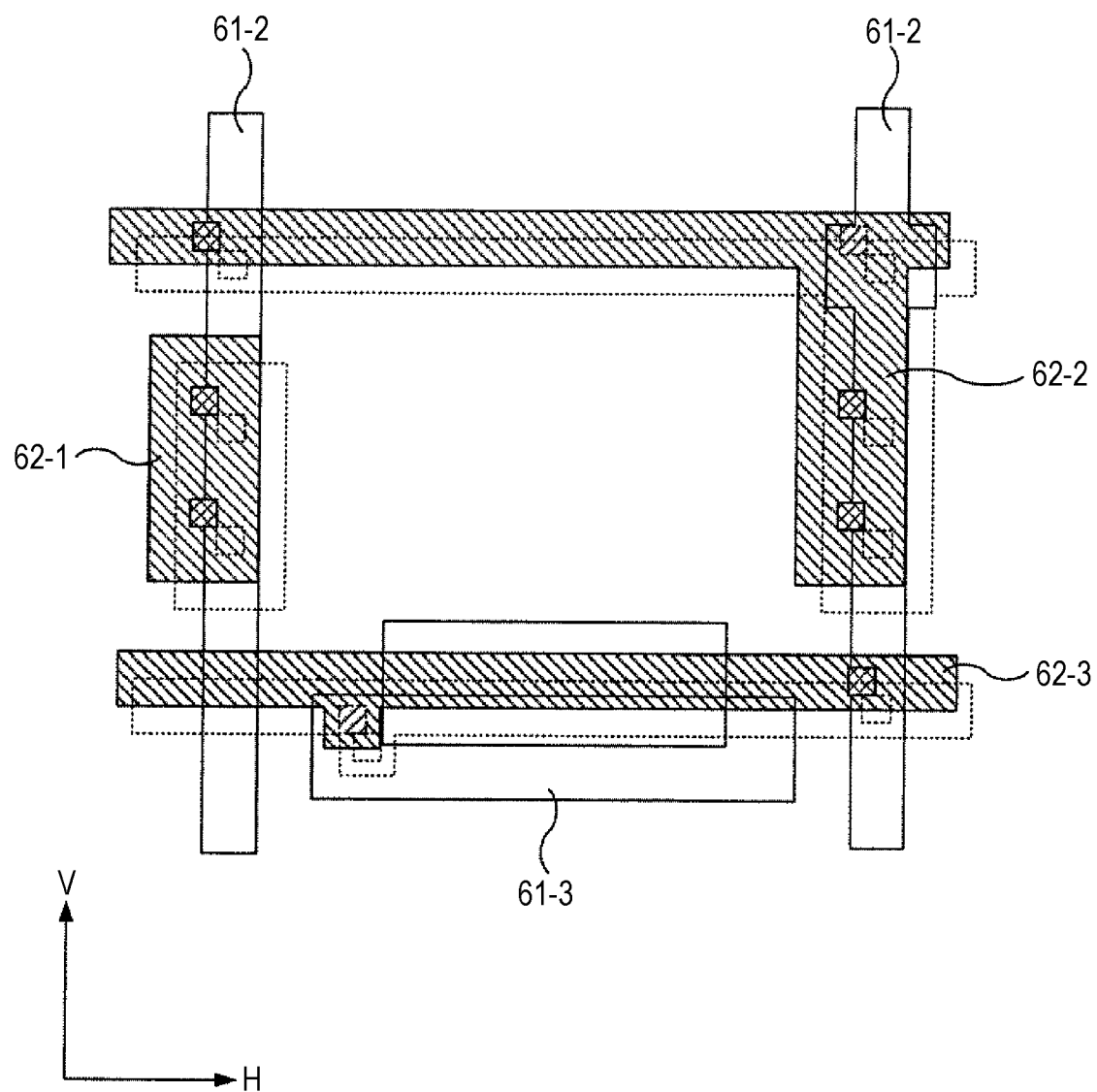
FIG. 11 is a diagram for explaining an amount of shift of the plural wiring bodies (with shifts in the vertical and horizontal directions)

In FIG. 11, the intermediate wiring layer 62 is shifted to the upper side in the vertical direction and the left side in the horizontal direction.

In this case, the center in the wiring width of the intermediate wiring layer 62 does not overlap the center in the wiring width of the bottom wiring layer 61.

The lower side intermediate wiring layer 62-3 overlaps the formation area of the photoelectric conversion unit 31. The overlap of the right side intermediate wiring layer 62-2 and the formation area of the photoelectric conversion unit 31 is large.

In this way, when the plural wiring layers 61 to 63 are superimposed while being shifted from one another, the intermediate wiring layer 62 and the top wiring layer 63 have the large overlap with the formation area of the photoelectric conversion unit 31 in the light receiving unit 21 viewed from above.

According to an increase in the number of pixels in recent years, pixel cells in the solid-state imaging device 11 are microminiaturized. Therefore, it is a problem how to secure the sensitivity of one pixel circuit 22 and prevent deterioration in the sensitivity.

In a digital lens reflex camera employing a lens detachable type, the plural pixel circuits 22 are arranged in array. Therefore, it is assumed that beams are made incident at various angles from the normal direction of the light receiving unit 21.

Therefore, in a lens replaceable camera, it is important to lead beams made incident at various angles to the photoelectric conversion unit 31 (the photodiode) while suppressing a loss.

In some case, the overlap of the plural wiring layers 61 to 63 and the formation area of the photoelectric conversion unit 31 worsens these problems.

In particular, among pixel cells arranged in a two-dimensional matrix shape, the worsening of the problem tends to be more conspicuous in pixels cells farther away from the center of the light receiving unit 21.

Such worsening causes deterioration in an image quality exceeding a characteristic of a lens.

Referring back to FIGS. 6 and 7, the plural wiring bodies 51 to 53 are formed to be superimposed one another and electrically connected by the via contacts 59 and 60.

Specifically, the bottom wiring body 51 is connected to the semiconductor substrate 110 by two via contacts 58.

The intermediate wiring body 52 is electrically connected to the bottom wiring body 51 by two via contacts 59.

The top wiring body 53 is electrically connected to the intermediate wiring body 52 by one via contact 60.

Consequently, the bottom wiring body 51, the intermediate wiring body 52, and the top wiring body 53 are electrically connected to one another and function as one wiring section 50.

Shapes of the Wiring Bodies 51 to 53

FIGS. 12A to 12C are diagrams of examples of wiring patterns of the bottom wiring layer 61, the intermediate wiring layer 62, and the top wiring layer 63 shown in FIG. 7.

FIG. 12A is a diagram of an example of a wiring pattern of the top wiring layer 63.

FIG. 12B is a diagram of an example of a wiring pattern of the intermediate wiring layer 62.

FIG. 12C is a diagram of an example of a wiring pattern of the bottom wiring layer 61.

As shown in FIG. 12A, the top wiring layer 63 includes the top wiring body 53 and a top connection conductor 57.

As shown in FIG. 12B, the intermediate wiring layer 62 includes the intermediate wiring body 52, a first intermediate connection conductor 56, and a second intermediate connection conductor 55.

As shown in FIG. 12C, the bottom wiring layer 61 includes the bottom wiring body 51 and a bottom connection conductor 54.

In the examples shown in FIGS. 12A to 12C, the top wiring body 53, the intermediate wiring body 52, and the bottom wiring body 51 are formed in the same wiring width.

The top connection conductor 57, the first intermediate connection conductor 56, the second intermediate connection conductor 55, and the bottom connection conductor 54 are formed in a substantially square shape.

One side of the top connection conductor 57 is joined to the top wiring body 53.

One sides of the intermediate connection conductors 55 and 56 are joined to the intermediate wiring body 52.

One side of the bottom connection conductor 54 is joined to the bottom wiring body 51.

The top connection conductor 57 is formed right above the first intermediate connection conductor 56 in terms of design.

As shown in FIGS. 6 and 7, the top connection conductor 57 is connected to the first intermediate connection conductor 56 by the via contact 60.

The second intermediate connection conductor 55 is formed right above the bottom connection conductor 54 in terms of design.

The second intermediate connection conductor 55 is connected to the bottom connection conductor 54 by the via contact 59.

The sizes of the top connection conductor 57, the first intermediate connection conductor 56, the second intermediate connection conductor 55, and the bottom connection conductor 54 are explained below.

FIG. 13 is a diagram for explaining the size of a connection conductor 80.

The connection conductor 80 connected to another connection conductor by a via contact needs to be electrically connected to the via contact. Therefore, the connection conductor 80 needs to be basically formed in size same as that of the via contact.

The connection conductor 80 in this case has the size of a square 81 on the innermost side in FIG. 13.

The connection conductor 80 and the via contact are manufactured in separate processes. Therefore, a formation position of the connection conductor 80 and a formation position of the via contact deviate from each other in terms of manufacturing.

Therefore, even when such positional deviation in terms of manufacturing occurs, the connection conductor 80 needs to be surely connected to the via contact.

The connection conductor 80 in this case has the size of a square 82 second from the inner side in FIG. 13.

When plural wiring bodies are superimposed while being shifted from one another, the connection conductor 80 needs to be surely connected to the via contact in a state in which the plural wiring bodies are shifted from each other.

The connection conductor 80 in this case has the size of a square 83 on the outer side in FIG. 13.

An area between the square 83 on the outer side and the square 82 second from the inner side in FIG. 13 is referred to as extension area 84.

The extension area 84 is an area that is necessary when the plural wiring bodies are superimposed while being shifted from one another and is unnecessary when the connection conductor 80 and the via contact do not deviate from each other.

When the wiring bodies 51 to 53 in the three layers are superimposed while being shifted from one another as shown in FIG. 7, the various connection conductors 54 to 57 basically need to be formed with the size of the square 83 on the outer side in FIG. 13 including the extension area 84.

However, in this embodiment, the top connection conductor 57, the first intermediate connection conductor 56, the second intermediate connection conductor 55, and the bottom connection conductor 54 are formed in sizes explained below.

Specifically, the top connection conductor 57 is formed in the size of the square 82 second from the inner side in FIG. 13 not including the extension area 84.

Consequently, the top connection conductor 57 can absorb the positional deviation of the via contacts 59 and 60 in terms of manufacturing with respect to the top connection conductor 57.

The first intermediate connection conductor 56 and the second intermediate connection conductor 55 are formed in the size of the square 82 second from the inner side in FIG. 9 including the line width of the intermediate wiring body 52 and not including the extension area 84.

Consequently, the first intermediate connection conductor 56 and the second intermediate connection conductor 55 can absorb the positional deviation of the via contacts 59 and 60 in terms of manufacturing with respect to the intermediate connection conductors 55 and 56.

The first intermediate connection conductor 56 and the second intermediate connection conductor 55 are formed in the size of the square 82 second from the inner side in FIG. 13 including the line width of the intermediate wiring body 52.

Therefore, the via contacts 59 and 60 connected to the first intermediate connection conductor 56 and the via contacts 59 and 60 connected to the second intermediate connection conductor 55 are directly connected to the intermediate wiring body 52.

The bottom connection conductor 54 is formed in the size of the square 83 on the outer side including the extension area 84 in FIG. 13.

Consequently, when the intermediate wiring body 52 is formed to be shifted from the bottom wiring body 51, the bottom wiring body 51 can absorb the positional deviation of the via contacts 59 and 60 in terms of manufacturing with respect to the bottom connection conductor 54.

When the top connection conductor 57, the first intermediate connection conductor 56, the second intermediate connection conductor 55, and the bottom connection conductor 54 are formed in a combination of such sizes, the via contacts 59 and 60 connected to the intermediate wiring layer 62 may be unable to be shifted with respect to the intermediate wiring layer 62.

Therefore, as shown in FIG. 7, an amount of shift of the intermediate wiring layer 62, an amount of shift of the via contacts 59 and 60 that connect the intermediate wiring layer 62 and the top wiring layer 63, and an amount of shift of the via contacts 59 and 60 that connect the intermediate wiring layer 62 and the bottom wiring layer 61 are the same.

Figure 14:
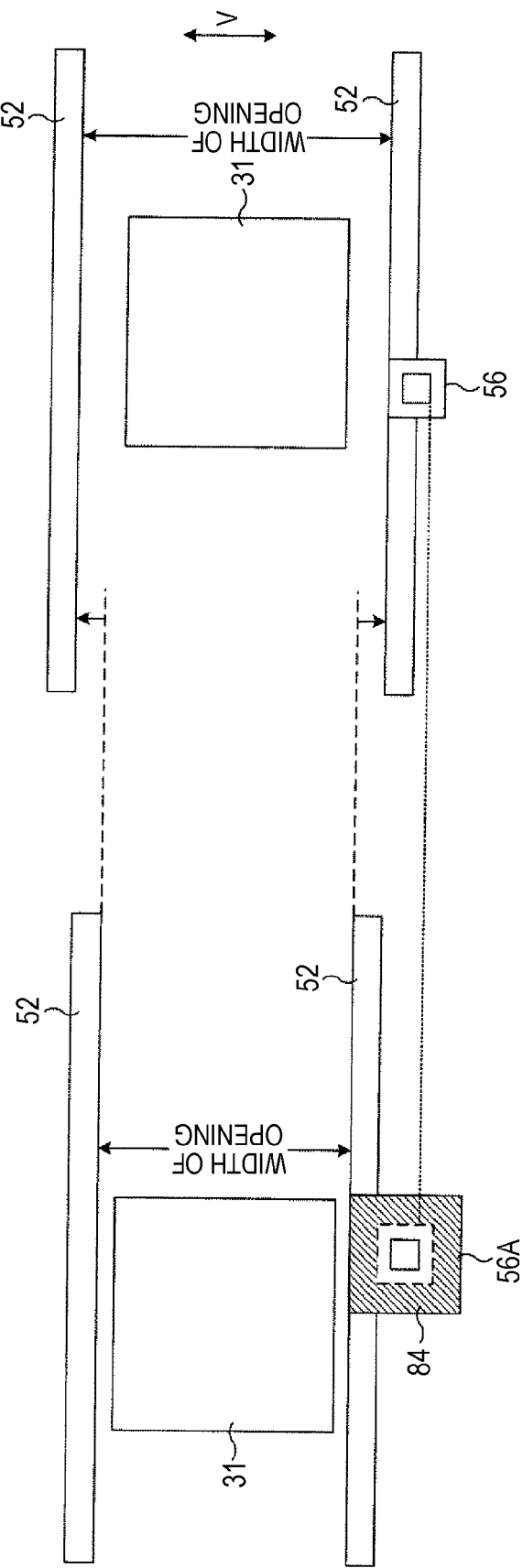

FIGS. 14A and 14B are diagrams for explaining the width of an opening formed by two intermediate wiring bodies 52 on both sides of one photoelectric conversion unit 31.

FIG. 14A is a diagram of an interval of the two intermediate wiring bodies 52 in a comparative example.

In the comparative example of FIG. 14A, an intermediate connection conductor 56A having the size of the square 83 on the outer side in FIG. 13 is connected to the intermediate wiring body 52.

FIG. 14B is a diagram of an interval of the two intermediate wiring bodies 52 in this embodiment.

In this embodiment, as explained above, the intermediate connection conductor 56 having the size of the square 83 on the outer side of FIG. 13 is connected to the intermediate wiring body 52.

In this embodiment, as shown in FIG. 14B, projection width (size) of the intermediate connection conductor 56A from the intermediate wiring body 52 is small.

Therefore, the width of respective wiring patterns is small compared with that in the comparative example of FIG. 14A.

Since the width of the wiring patterns is small, the interval (the width of the opening) of the two intermediate wiring bodies 52 on both the sides of one photoelectric conversion unit 31 can be increased.

Figure 15:
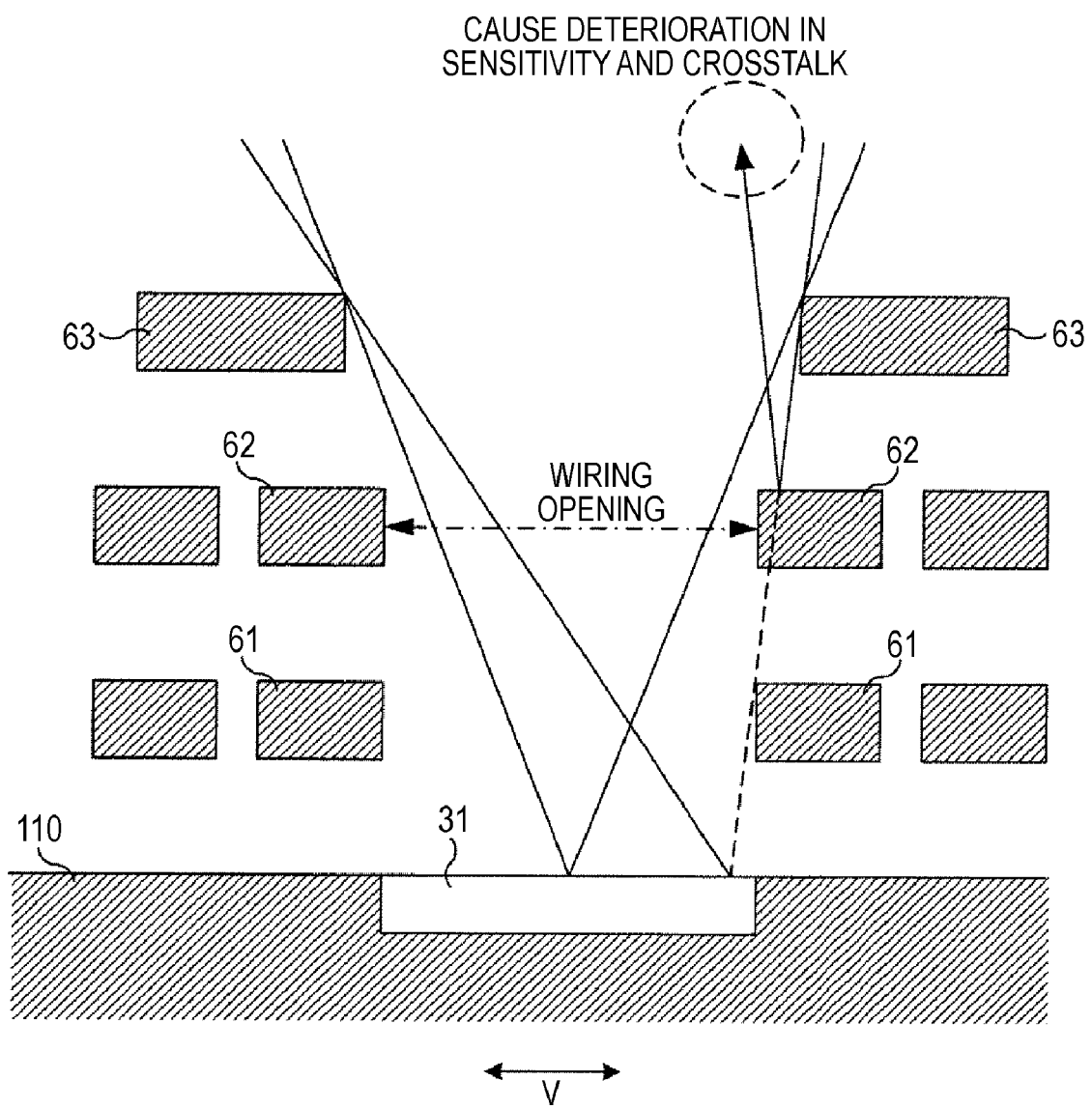
FIG. 15 is a diagram for explaining the width of the opening in the comparative example shown in FIG. 14A.

FIG. 15 is a diagram for explaining the width of the opening in the comparative example shown in FIG. 14A.

Figure 16:
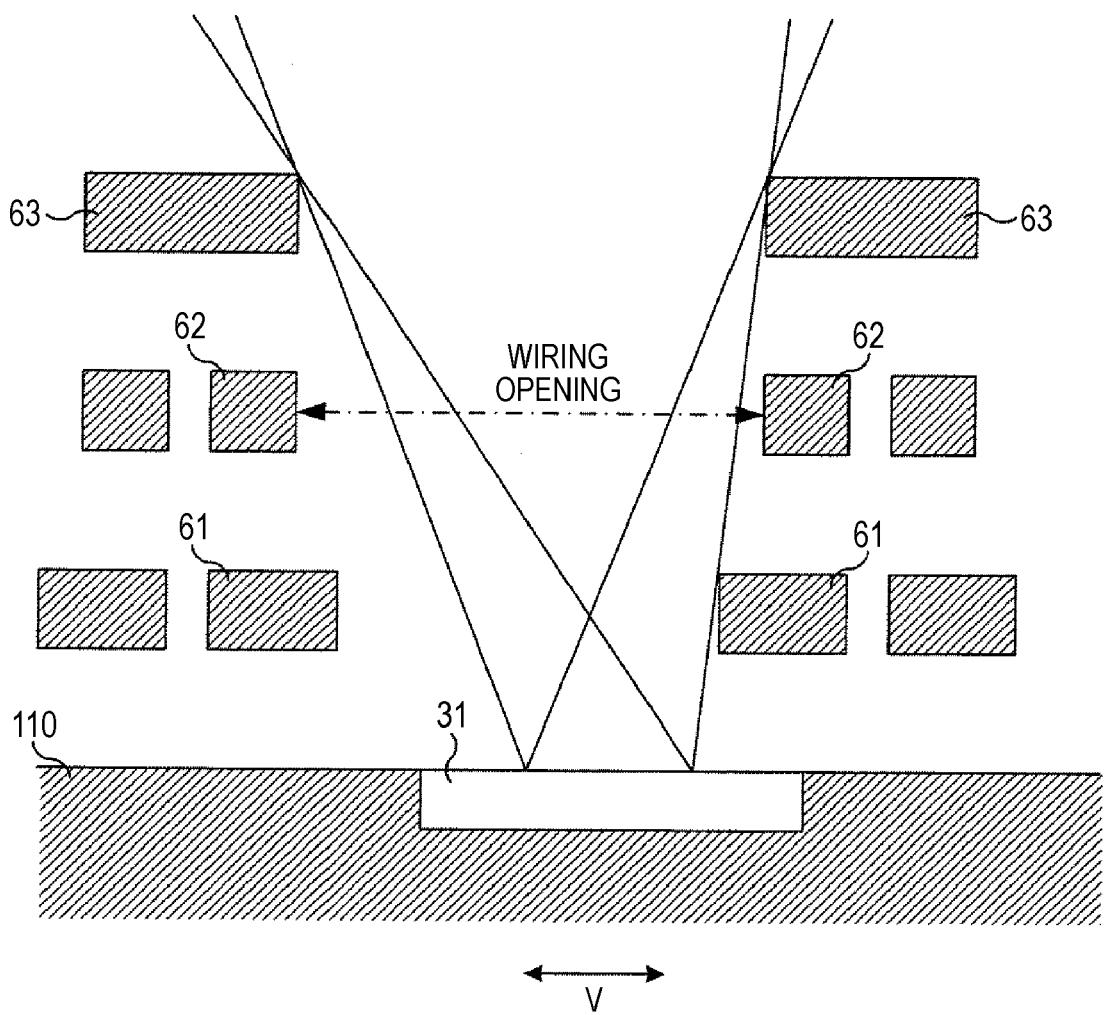
FIG. 16 is a diagram for explaining the width of the opening in the embodiment shown in FIG. 14B.

FIG. 16 is a diagram for explaining the width of the opening in this embodiment shown in FIG. 14B.

In this embodiment, as shown in FIG. 14B, the width of a wiring opening of the intermediate wiring layer 62 is increased.

Therefore, as shown in FIG. 16, the intermediate wiring layer 62 fits within a space between the top wiring layer 63 and the bottom wiring layer 61.

Specifically, the end on a leading end side in a shifting direction of the intermediate wiring body 52 is located further on an inner side in the shifting direction than a surface including the end on the leading end side in the shifting direction of the top wiring body 53 and the end of the bottom wiring body 51 on the shifting direction side.

For example, in the intermediate wiring body 52 on the right side in FIG. 16, the left end of the intermediate wiring body 52 is located further on a right inner side than a surface including the left end of the top wiring body 53 and the left end of the bottom wiring body 51.

Therefore, in this embodiment, light that has passed between adjacent two top wiring layers 63 is not reflected at the end of the intermediate wiring body 52.

Since the light is not reflected at the end of the intermediate wiring body 52, the light is not made incident on the next photoelectric conversion unit 31.

As a result, it is possible to reduce optical crosstalk between pixels.

Operation of the Imaging Apparatus 1

The operation of the imaging apparatus 1 shown in FIG. 1 is explained below.

When a signal generated by the operation of the imaging key is input from the operation unit 13, the control unit 16 instructs the solid-state imaging device 11 to start imaging.

According to the instruction, the solid-state imaging device 11 starts readout processing.

In the readout processing, the solid-state imaging device 11 causes, for example, using the line selection circuit 112 and the shutter row selection circuit 113, the plural pixel circuits 22 to operate row by row.

The row selection circuit 112 and the shutter row selection circuit 113 control, for example, the transfer signal lines 43 and the selection signal lines 44 in plural rows to change from a low level to a high level in order row by row.

Consequently, the plural pixel output lines 46 are controlled by the pixel circuit 22 in a controlled row to change to a level corresponding to an amount of received light of the photoelectric conversion unit 31 in the row.

The correlated double sampling circuit 114 generates, in order row by row, signals corresponding to amounts of received light of the plural pixel circuits 22 on the basis of a correlation between an output level of the pixel circuits 22 during reset measured in advance and an output level of the pixel circuits 22 read out during imaging.

The correlated double sampling circuit 114 outputs the signals of the amounts of the received light of the plural pixel circuits 22 in order row by row in synchronization with a synchronization signal from the row selection circuit 112.

The AGC circuit 117 amplifies the signals of the amounts of the received light.

The analog-to-digital converter 118 samples the signals of the amounts of the received light and obtains data of the amounts of the received light of the plural pixel circuits 22.

The digital amplifier circuit 119 generates an output signal including the data of the amounts of the received light of the plural pixel circuits 22 in the order of the read-out rows.

A series of operation of these circuits is executed in synchronization with a synchronization signal from the timing generator 116.

According to the readout processing, the solid-state imaging device 11 outputs, to the signal processing circuit 12, an output signal of the values of the amounts of the received light of the plural pixel circuits 22 (the photoelectric conversion units 31) two-dimensionally arrayed in the light receiving unit 21.

The signal processing circuit 12 generates full-color image data of R, G, and B from the output signal of the solid-state imaging device 11. The signal processing circuit outputs, for example, an image signal including the full-color image data to the system bus 19.

When the image signal is output to the system bus 19, the memory 17 captures the image signal and stores the image data included in the image signal.

The serial interface unit 18 captures the image signal output to the system bus 19 and stores the image data included in the image signal in the semiconductor memory card 20.

The display unit 14 captures the image signal output to the system bus 19 and displays an image of the image data included in the image signal.

Consequently, the image picked up by the imaging apparatus 1 is stored in the semiconductor memory card 20 or the like. A user can check, according to the display on the display unit 14, the image picked up by the imaging apparatus 1.

As explained above, in the solid-state imaging device 11 according to this embodiment, the top wiring layer 63 and the intermediate wiring layer 62 are shifted from the position at the top of the bottom wiring layer 61 in order to perform optical correction.

In this embodiment, an amount of shift of the intermediate wiring layer 62 (the intermediate wiring body 52) and the via contacts 59 and 60 connected thereto is standardized.

Therefore, in this embodiment, although an effect of optical correction is obtained, since the extension area 84 is not given to the intermediate wiring layer 62, it is possible to enlarge the opening in the intermediate wiring layer 62.

In this embodiment, the extension area 84 is given to only the bottom wiring layer 61 and is not given to the top wiring layer 63 and the intermediate wiring layer 62.

Therefore, it is likely that an amount of shift of the top wiring layer 63 and the intermediate wiring layer 62 is insufficient in pixels in a peripheral portion in a longitudinal direction of the light receiving unit 21.

However, in this embodiment, the width of the opening of the top wiring layer 63 and the width of the opening of the intermediate wiring layer 62 are increased.

Therefore, in this embodiment, it is possible to suppress eclipse of light by the top wiring layer 63 or the intermediate wiring layer 62 due to the insufficiency of the amount of shift of the top wiring layer 63 and the intermediate wiring layer 62.

Consequently, in this embodiment, it is possible to suppress deterioration in sensitivity caused by eclipse of incident light due to wiring.

In this embodiment, it is possible to suppress crosstalk between adjacent pixels due to reflected light.

In this embodiment, an opening between wires is increased by reducing the size of the connection conductors.

Therefore, in this embodiment, even when the light receiving unit 21 of the solid-state imaging device 11 is long in, for example, the horizontal direction, an effect of eclipse suppression equivalent to that obtained when wires are shifted can be obtained in incident light on the pixel circuits 22 located away from the center of the light receiving unit 21 in the vertical direction.

In this embodiment, in the horizontal direction, even if an amount of shift for each of the wiring sections 50 is reduced from that in the past, it is possible to solve the problems of the deterioration in sensitivity and the crosstalk in the cells of the pixel circuits 22 spaced away from the center of the light receiving unit 21.

The embodiment explained above is a preferred embodiment of the present invention. However, the present invention is not limited to this. The embodiment can be variously modified or changed without departing from the spirit of the present invention.

In the embodiment, the top connection conductor 57 is formed in the size of the square 82 second from the inner side in FIG. 13 not including the extension area 84.

Besides, for example, the top connection conductor 57 may be formed in the size of the square 83 on the outer side in FIG. 13 including the extension area 84.

In the embodiment, the first intermediate connection conductor 56 and the second intermediate connection conductor 55 are formed in the size of the square 82 second from the inner side in FIG. 9 including the line width of the intermediate wiring body 52 and not including the extension area 84.

Besides, for example, the first intermediate connection conductor 56 and the second intermediate connection conductor 55 may be formed in the size of the square 82 second from the inner side in FIG. 9 not including the extension area 84 separately from the line width of the intermediate wiring body 52.

In the embodiment, in the plural wiring sections 50 shown in FIGS. 5A to 5C, all the amounts of shift of the respective intermediate wiring bodies 52 with respect to the respective bottom wiring bodies 51 are zero in the direction perpendicular to the paper surface of FIGS. 5A to 5C.

Besides, for example, in the plural wiring sections 50, all the amounts of shift of the respective intermediate wiring bodies 52 with respect to the respective bottom wiring bodies 51 may be an amount other than zero in the direction perpendicular to the paper surface of FIGS. 5A to 5C.

Further, besides, for example, in the plural wiring sections 50, the amounts of shift of the respective intermediate wiring bodies 52 with respect to the respective bottom wiring bodies 51 may be amounts different from one another in the direction perpendicular to the paper surface of FIGS. 5A to 5C.

In the embodiment, in the light receiving unit 21, the wiring section 50 is provided between the adjacent two photoelectric conversion units 31.

Besides, for example, the wiring section 50 may be provided for every three or more photoelectric conversion units 31.

In the embodiment, the plural pixel circuits 22 are formed as the circuits independent from one another.

Besides, for example, the plural pixel circuits 22 may share, in the adjacent two pixel circuits 22, the floating diffusion 36, the amplification transistor 33, the selection transistor 34, and the reset transistor 35.

In the embodiment, the wiring sections 50 are formed in the three layers of the bottom wiring body 51, the intermediate wiring body 52, and the top wiring body 53.

Besides, for example, the wiring section 50 may have the intermediate wiring bodies 52 in plural layers and may be configured by wiring bodies in four or more layers.

In this embodiment, the wiring sections 50 are formed in the solid-state imaging device 11 including the CMOS sensor.

Besides, for example, the wiring sections 50 may be formed in the solid-state imaging device 11 including a CCD (Charge Coupled Device) sensor.

In the embodiment, the ground potential and power supply potential VDD are fed to the pixel circuits 22 by the ground line 41 and the power supply line 42.

Besides, for example, the ground potential and substrate potential VSS may be fed to the pixel circuits 22.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a semiconductor substrate;
   plural photoelectric conversion units that are formed in array on the semiconductor substrate and form a light receiving unit on a semiconductor substrate; and
   plural wiring sections formed in positions among the plural photoelectric conversion units on the light receiving unit,
   wherein,
      each of the plural wiring sections includes
         plural wiring bodies respectively formed by superimposing plural wiring layers on the light receiving unit on the semiconductor substrate and including a bottom wiring body on the semiconductor substrate side, a top wiring body on an uppermost side, and an intermediate wiring body between the bottom wiring body and the top wiring body, and
         plural contacts that connect the plural wiring bodies in order of vertical overlap,
      in at least one of the plural wiring sections, the wiring bodies other than the bottom wiring body are superimposed while being shifted from a position right above the bottom wiring body, and an amount of shift of the intermediate wiring body and an amount of shift of the plural contacts connected to the intermediate wiring body are the same, and
      in the at least one wiring section,
         a conductive layer including the intermediate wiring body includes an intermediate connection conductor connected to the intermediate wiring body and configured to connect the contacts to the intermediate wiring body, and
         the intermediate connection conductor is formed in minimum size that can absorb positional deviation of the contacts in terms of manufacturing with respect to the intermediate wiring body.

2. A solid-state imaging device according to claim 1, wherein, in the at least one wiring section, the contacts connected to the intermediate wiring body are directly connected to the intermediate wiring body.

3. A solid-state imaging device according to claim 1, wherein, in the at least one wiring section:
   the intermediate wiring body is formed in predetermined line width, and
   the intermediate connection conductor is formed in the line width of the intermediate wiring body and in minimum size that can absorb positional deviation of the contacts in terms of manufacturing with respect to the intermediate wiring body.

4. A solid-state imaging device according to claim 1 or 3, wherein, in the at least one wiring section:
   a conductive layer including the bottom wiring body includes a bottom connection conductor connected to the bottom wiring body and configured to absorb, in a state in which the intermediate wiring body deviates with respect to the bottom wiring body, positional deviation of the contacts in terms of manufacturing with respect to the bottom wiring body and connect the contacts, which are connected to the intermediate wiring body, to the bottom wiring body, and
   the size of the intermediate connection conductor is smaller than size of the bottom connection conductor.

5. A solid-state imaging device according to claim 4, wherein:
   the intermediate wiring body and the top wiring body are formed to be shifted in a same direction from the position right above the bottom wiring body, and
   an end on a leading end side in a shifting direction of the intermediate wiring body is located further on an inner side in the shifting direction than a surface including an end on the leading end side in the shifting direction of the top wiring body and an end of the bottom wiring body on the shifting direction side.

6. A solid-state imaging device according to claim 1, wherein, in one wiring section other than the at least one wiring section among the plural wiring sections, the wiring bodies other than the bottom wiring body are superimposed in the position right above the bottom wiring body.

7. A solid-state imaging device according to claim 1, wherein:
   the plural photoelectric conversion units are two-dimensionally arrayed in the light receiving unit,
   the plural wiring sections extend along one of directions of the two-dimensionally array,
   the at least one wiring section is plural wiring sections, and
   in the plural wiring sections, amounts of shift of the wiring bodies other than a plurality of the bottom wiring bodies with respect to the bottom wiring bodies are the same in the one array direction of the plural photoelectric conversion units and are different from one another in the other of the directions of the two-dimensional array.

8. A solid-state imaging device according to claim 1, wherein:
   the plural photoelectric conversion units are two-dimensionally arrayed in the light receiving unit, the plural wiring sections extend along one of directions of the two-dimensionally array, the at least one wiring section is plural wiring sections, and in the plural wiring sections, amounts of shift of the wiring bodies other than a plurality of the bottom wiring bodies with respect to the bottom wiring bodies are zero in the one array direction of the plural photoelectric conversion units and are different from one another in the other of the directions of the two-dimensional array.

9. A solid-state imaging device according to claim 7 or 8, wherein:

the plural wiring sections are shifted toward a center of the light receiving unit, and an amount of shift in the wiring sections on the center side of the light receiving units is smaller than an amount of shift of the wiring sections on an outer side.

10. A solid-state imaging device according to claim 1, wherein the plural wiring sections are used as power supply lines or signal lines.

11. An imaging apparatus comprising:

an optical unit that condenses light; and a solid-state imaging device that receives the light condensed by the optical unit, wherein, (a) the solid-state imaging device includes a semiconductor substrate, plural photoelectric conversion units that are formed in array on the semiconductor substrate and form a light receiving unit on a semiconductor substrate, and plural wiring sections formed in positions among the plural photoelectric conversion units on the light receiving unit, and (b) each of the plural wiring sections includes plural wiring bodies respectively formed by superimposing plural wiring layers on the light receiving unit on the semiconductor substrate and including a bottom wiring body on the semiconductor substrate side, a top wiring body on an uppermost side, and an intermediate wiring body between the bottom wiring body and the top wiring body, and plural contacts that connect the plural wiring bodies in order of vertical overlap, (c) in at least one of the plural wiring sections, the wiring bodies other than the bottom wiring body are superimposed while being shifted from a position right above the bottom wiring body, and an amount of shift of the intermediate wiring body and an amount of shift of the plural contacts connected to the intermediate wiring body are the same, and (d) in the at least one wiring section, a conductive layer including the intermediate wiring body includes an intermediate connection conductor connected to the intermediate wiring body and configured to connect the contacts to the intermediate wiring body, and the intermediate connection conductor is formed in minimum size that can absorb positional deviation of the contacts in terms of manufacturing with respect to the intermediate wiring body.

12. A solid-state imaging device comprising:

a semiconductor substrate;

plural photoelectric conversion units that are formed in array on the semiconductor substrate and form a light receiving unit on a semiconductor substrate; and plural wiring sections formed in positions among the plural photoelectric conversion units on the light receiving unit, wherein, (a) each of the plural wiring sections includes plural wiring bodies respectively formed by superimposing plural wiring layers on the light receiving unit on the semiconductor substrate and including a bottom wiring body on the semiconductor substrate side, a top wiring body on an uppermost side, and an intermediate wiring body between the bottom wiring body and the top wiring body, and plural contacts that connect the plural wiring bodies in order of vertical overlap, (b) in at least one of the plural wiring sections, the wiring bodies other than the bottom wiring body are superimposed while being shifted from a position right above the bottom wiring body, and an amount of shift of the intermediate wiring body and an amount of shift of the plural contacts connected to the intermediate wiring body are the same, and (c) in the at least one wiring section, a conductive layer including the intermediate wiring body includes an intermediate connection conductor connected to the intermediate wiring body and configured to connect the contacts to the intermediate wiring body, the intermediate connection conductor is formed in minimum size that can absorb positional deviation of the contacts in terms of manufacturing with respect to the intermediate wiring body, the intermediate wiring body is formed in predetermined line width, and the intermediate connection conductor is formed in the line width of the intermediate wiring body and in minimum size that can absorb positional deviation of the contacts in terms of manufacturing with respect to the intermediate wiring body.

13. A solid-state imaging device comprising:

a semiconductor substrate;

plural photoelectric conversion units that are formed in array on the semiconductor substrate and form a light receiving unit on a semiconductor substrate; and plural wiring sections formed in positions among the plural photoelectric conversion units on the light receiving unit, wherein, (a) each of the plural wiring sections includes plural wiring bodies respectively formed by superimposing plural wiring layers on the light receiving unit on the semiconductor substrate and including a bottom wiring body on the semiconductor substrate side, a top wiring body on an uppermost side, and an intermediate wiring body between the bottom wiring body and the top wiring body, and plural contacts that connect the plural wiring bodies in order of vertical overlap, and (b) in at least one of the plural wiring sections, the wiring bodies other than the bottom wiring body are superimposed while being shifted from a position right above the bottom wiring body, and an amount of shift of the intermediate wiring body and an amount of shift of the plural contacts connected to the intermediate wiring body are the same, (c) in the at least one wiring section,
- a conductive layer including the intermediate wiring body includes an intermediate connection conductor connected to the intermediate wiring body and configured to connect the contacts to the intermediate wiring body,
- the intermediate connection conductor is formed in minimum size that can absorb positional deviation of the contacts in terms of manufacturing with respect to the intermediate wiring body, and
- a conductive layer including the bottom wiring body includes a bottom connection conductor connected to the bottom wiring body and configured to absorb, in a state in which the intermediate wiring body deviates with respect to the bottom wiring body, positional deviation of the contacts in terms of manufacturing with respect to the bottom wiring body and connect the contacts, which are connected to the intermediate wiring body, to the bottom wiring body, and (d) the size of the intermediate connection conductor is smaller than size of the bottom connection conductor.

14. A solid-state imaging device comprising:

a semiconductor substrate;

plural photoelectric conversion units that are formed in array on the semiconductor substrate and form a light receiving unit on a semiconductor substrate; and plural wiring sections formed in positions among the plural photoelectric conversion units on the light receiving unit, wherein,
(a) each of the plural wiring sections includes
- plural wiring bodies respectively formed by superimposing plural wiring layers on the light receiving unit on the semiconductor substrate and including a bottom wiring body on the semiconductor substrate side, a top wiring body on an uppermost side, and an intermediate wiring body between the bottom wiring body and the top wiring body, and
- plural contacts that connect the plural wiring bodies in order of vertical overlap, and (b) in at least one of the plural wiring sections, the wiring bodies other than the bottom wiring body are superimposed while being shifted from a position right above the bottom wiring body, and an amount of shift of the intermediate wiring body and an amount of shift of the plural contacts connected to the intermediate wiring body are the same, and (c) in the at least one wiring section,
- a conductive layer including the intermediate wiring body includes an intermediate connection conductor connected to the intermediate wiring body and configured to connect the contacts to the intermediate wiring body, and
- the intermediate connection conductor is formed that can absorb positional deviation of the contacts in terms of manufacturing with respect to the intermediate wiring body.

* * * * *